(12) United States Patent
Naya et al.

(10) Patent No.: US 7,099,733 B2
(45) Date of Patent: Aug. 29, 2006

(54) SEMICONDUCTOR PRODUCTION SYSTEM

(75) Inventors: Hidemitsu Naya, Hitachi (JP); Rikio Tomiyoshi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/887,976

(22) Filed: Jul. 12, 2004

(65) Prior Publication Data
US 2005/0015165 A1   Jan. 20, 2005

(30) Foreign Application Priority Data
Jul. 14, 2003   (JP) .............................. 2003-196698

(51) Int. Cl.
*G06F 19/00* (2006.01)

(52) U.S. Cl. ...................... 700/121; 700/108; 700/109; 700/110; 716/4; 716/5; 438/14

(58) Field of Classification Search ................. 700/95, 700/97, 98, 108, 109, 110, 121, 100; 438/14, 438/16, 17, 200, 254; 716/1, 4, 5, 19, 21
See application file for complete search history.

(56) References Cited

U.S. PATENT DOCUMENTS

| | | | |
|---|---|---|---|
| 5,907,773 A * | 5/1999 | Ikemasu et al. ............ 438/254 |
| 6,505,328 B1 | 1/2003 | Van Ginneken et al. | |
| 6,591,207 B1 | 7/2003 | Naya et al. | |
| 6,744,266 B1 * | 6/2004 | Dor et al. .................... 324/751 |
| 6,826,443 B1 * | 11/2004 | Makinen .................... 700/121 |
| 6,898,779 B1 * | 5/2005 | Juengling .................... 700/121 |
| 6,934,928 B1 * | 8/2005 | Juengling .................... 716/21 |
| 2002/0072162 A1 * | 6/2002 | Dor et al. .................... 438/200 |

FOREIGN PATENT DOCUMENTS

| JP | 2002-296753 | 10/2002 |
|---|---|---|
| JP | 2002-299211 | 10/2002 |

OTHER PUBLICATIONS

Keating, Michael., et al "Reuse Methodology Manual For System-On-A-Chip Designs." 1998, Boston, pp. 178-181.

* cited by examiner

*Primary Examiner*—Leo Picard
*Assistant Examiner*—Charles Kasenge
(74) *Attorney, Agent, or Firm*—McDermott Will & Emery LLP

(57) ABSTRACT

A semiconductor production system has storage devices for storage of all kinds of information including, but not limited to, the information concerning semiconductor design and information as to semiconductor manufacture along with information relating to semiconductor inspection processes, while representing as a class an instance added with meta data indicative of the role of the information in accordance with a logical expressive form. The system has a network for the storage device use, called the storage area network or "SAN". The SAN is for interconnection between respective ones of the storage devices, semiconductor manufacturing apparatuses and a semiconductor inspection apparatus. The storage devices are seamlessly accessible from any one of the semiconductor manufacture apparatuses and the semiconductor inspection apparatus and also from a semiconductor design environment associated therewith.

15 Claims, 24 Drawing Sheets

SEMICONDUCTOR PRODUCTION SYSTEM

BACKGROUND OF THE INVENTION

The present invention relates generally to semiconductor production systems and, more particularly, to a semiconductor production system capable of improving the accuracy of design, manufacture and inspection processes and also improving throughputs thereof.

In cases where a certain tool outputs a processing result to a file with its format compliant with the currently established standard format, when the input format of another tool fails to comply with the standard format, a need is felt to perform extra works for converting the standard format-compliant output file into the different input format.

A technique for obtaining a processing result in a desired format is disclosed, for example, in FIG. 10-1 on page 180 of "Reuse Methodology Manual," (ISBN 0-7923-8175-0). In the technique as taught thereby, the desirably formatted processing result is obtainable by repeating a process including the steps of inputting, when a certain tool outputs its processing result into a file with its format compliant with a standard format, this output to another tool, and then outputting this into a file with its own format compatible with another format which is different from the standard format.

Another technique is disclosed in JP-A-2002-296753, which changes the format of a file being input to a device or apparatus in a way conformity with the characteristics of the individual apparatus and then applies required processing, such as sorting or the like, to the contents of such file. For example, it is suggested therein to process the content of a file with a computer aided design (CAD) format which becomes an input of a mask fabrication apparatus. The resultant file is then input to the mask fabrication apparatus, thereby enabling the mask inspection procedure to increase in efficiency.

In addition, in JP-A-2002-299211, a technique is disclosed for reading the standard format-compliant file and for performing the processing which converts it into a "unique" format used inside the apparatus per se. An example shown therein is that in an electron beam drawing apparatus which is one of the currently available mask fabrication apparatuses, when inputting a file with the CAD format, more than one graphic form contained in this file is disassembled into an ensemble of elementary graphical components with prespecified shapes, such as for example rectangles or trapezoids. The input file is then converted into an image draw format unique to the apparatus.

Additionally in U.S. Pat. No. 6,505,328, it is taught that a common database is provided for logic design in order to avoid the format conversion problems stated above.

In the prior art approaches stated supra, the operation linkup capability between tools and also the cooperating capability between apparatuses are realized by sending and receiving—namely, interchanging—those files with their formats compatible with the standard format. Due to this, complicated and time-consuming works are required, such as file format conversion and others. Additionally, either a decrease in accuracy or dropout of information must take place during the conversion process. In particular, the missing of information is significantly appreciable in the case of CAD-formatted mask fabrication data.

For the mask fabrication data, it is a typical approach to utilize a specific CAD format, called the graphic design system II (GDSII). Unfortunately, the information representable by this CAD format is limited to graphical information only. That is, any information concerning semiconductors is not included therein. Accordingly, it is hardly possible to identify the individual graphic information as discrete parts or components, such as semiconductor circuit elements, wiring lines, dummy patterns or equivalents thereto. For this reason, it is impossible to apply the optimum processing to every graphic form—i.e., on a per-component basis.

As shown in the above-cited JP-A-2002-299211, it is possible to eliminate the need for complicated works such as format conversion and the like, by commonly using or "commonizing" the CAD format for both the mask fabrication apparatus and the mask inspection apparatus. However, this approach is deficient in increase of inspection/testing throughputs of the mask inspection apparatus. In other words, providing the common database makes it possible to lighten the complexity of format conversion. However, this common database is realized while letting it be limited in use to the data handled in the field of logic circuit design only. Obviously, when using it for post-processes of the mask fabrication apparatus and/or mask inspection apparatus to be done after the logic circuit design stage, what can be achieved is only the processing that is merely equivalent in level to the currently established ones.

SUMMARY OF THE INVENTION

The present invention was made in view of these problems, and provides a semiconductor production system capable of seamlessly dealing with the information as to semiconductor design, manufacture and inspection processes.

To solve the problems above, this invention employed the means which follows.

More than one storage device is employed for storing information concerning semiconductor design and information as to semiconductor fabrication and also every information of semiconductor inspection while representing as a class an instance added with meta data indicative of a role of the information in accordance with a logical expressive form. The storage device is operatively associated with a storage device-use network. This network is for connection between respective ones of the storage device and a semiconductor manufacture apparatus and also a semiconductor inspection apparatus. The storage device is seamlessly accessible from any one of the semiconductor manufacture apparatus and the semiconductor inspection apparatus and also from a semiconductor design environment.

Other objects, features and advantages of the invention will become apparent from the following description of the embodiments of the invention taken in conjunction with the accompanying drawings.

DESCRIPTION OF THE EMBODIMENTS

Figure 1:
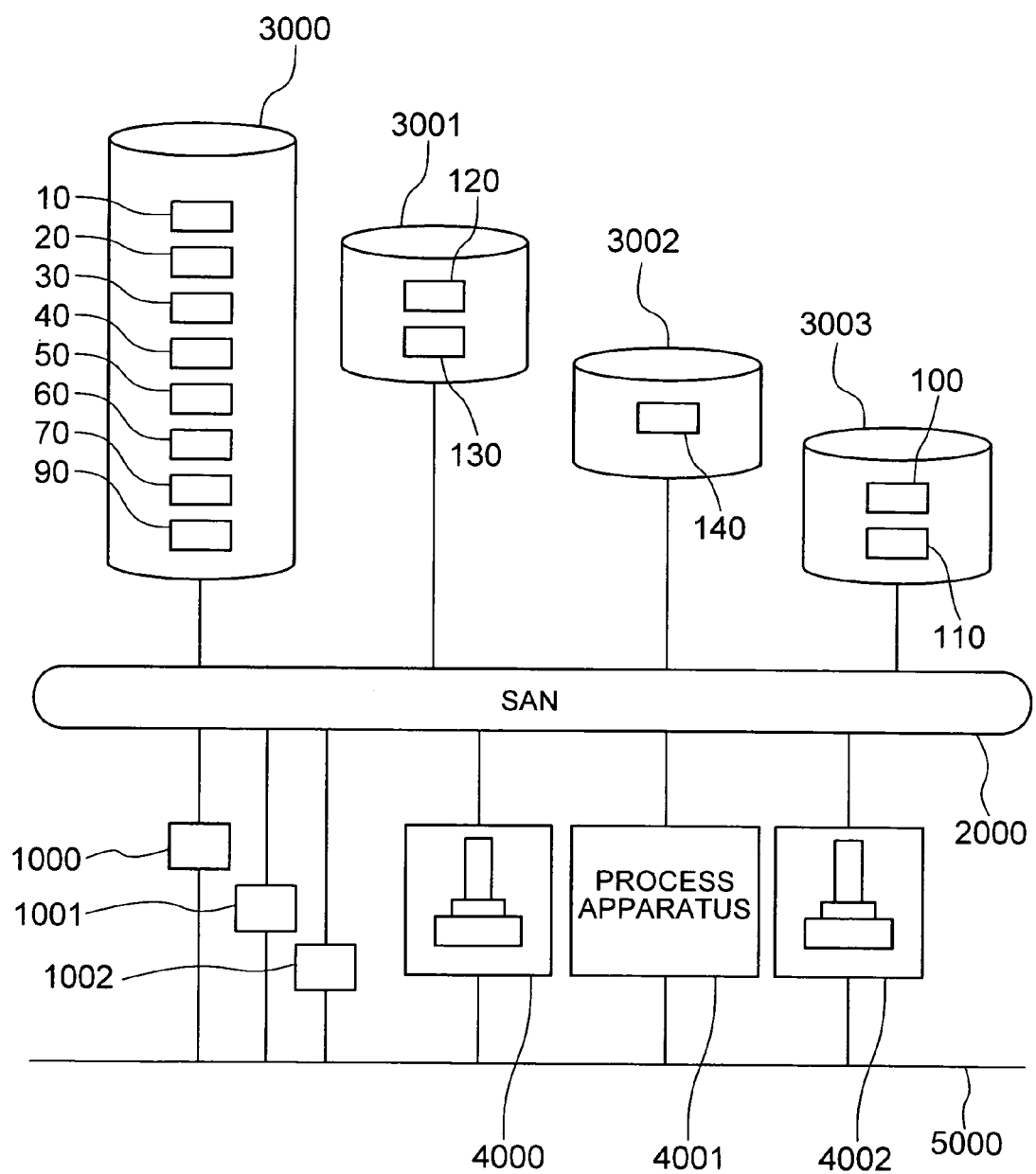
FIG. 1 is a diagram for explanation of a semiconductor production system in accordance with an embodiment of the present invention.

Embodiments of the invention will be explained with reference to the accompanying drawings below. FIG. 1 is a diagram for explanation of a semiconductor production system in accordance with an embodiment of the invention. The semiconductor production system shown in FIG. 1 is arranged to include storage devices ("volumes") 3000 to 3003, computers 1001–1002 for use as design environments, semiconductor manufacturing apparatuses 4000–4001 and an inspection apparatus 4002. These devices and apparatuses are operatively interconnected together via a storage device-use network (for example, a storage area network or "SAN").

As shown in FIG. 1, the volume 3000 stores therein an instance of logic design information 10, an instance of chip information 20, an instance of network ("net") information 30, an instance of layer information 40, an instance of element information 50, an instance of cell information 60, an instance of layout information 70, and an instance of "child" class of graphic information 90.

The volume 3001 stores therein material information 120 and processing results 130. The volume 3002 stores priority information 140. The volume 3003 stores an instance of child class of characteristics information 100 and an instance of process information 110. Additionally these volumes are connected to SAN 2000.

The computers 1000–1002, the lithography apparatus 4000 such as a mask-use electron beam drawing apparatus, the process apparatus 4001 such as chemical vapor deposition (CVD) or the like, and the inspection apparatus 4002 such as a scanning electron microscope (SEM) or else are connected to the SAN 2000 and a network 5000.

In case the SAN is used as the storage device-use network 2000, Fibre channel (FC) is utilized as network media. The protocol usable in this case is FC-SCSI or else. In the case of using Ethernet (registered trademark), the protocol such as iSCSI or the like is to be used. Additionally in case the storage device network is a wide area network (WAN), the intended network environment is establishable by using the FC and Ethernet (registered trademark) architectures in combination. For example, by intervening protocol transformation such as FC-IP and/or iFCP or else, it becomes possible to achieve communications of long distance transfer portions in the form of IP packets. Due to this, it is possible to realize the storage device network 2000 with extensive coverage. Note here that the above-noted volume is a unit indicative of a physical storage device or alternatively a logical storage device. By constituting the network in this way, it becomes possible for any one of the apparatuses involved therein to provide access to the information being stored in physically or logically dispersed storage devices.

Figure 2:
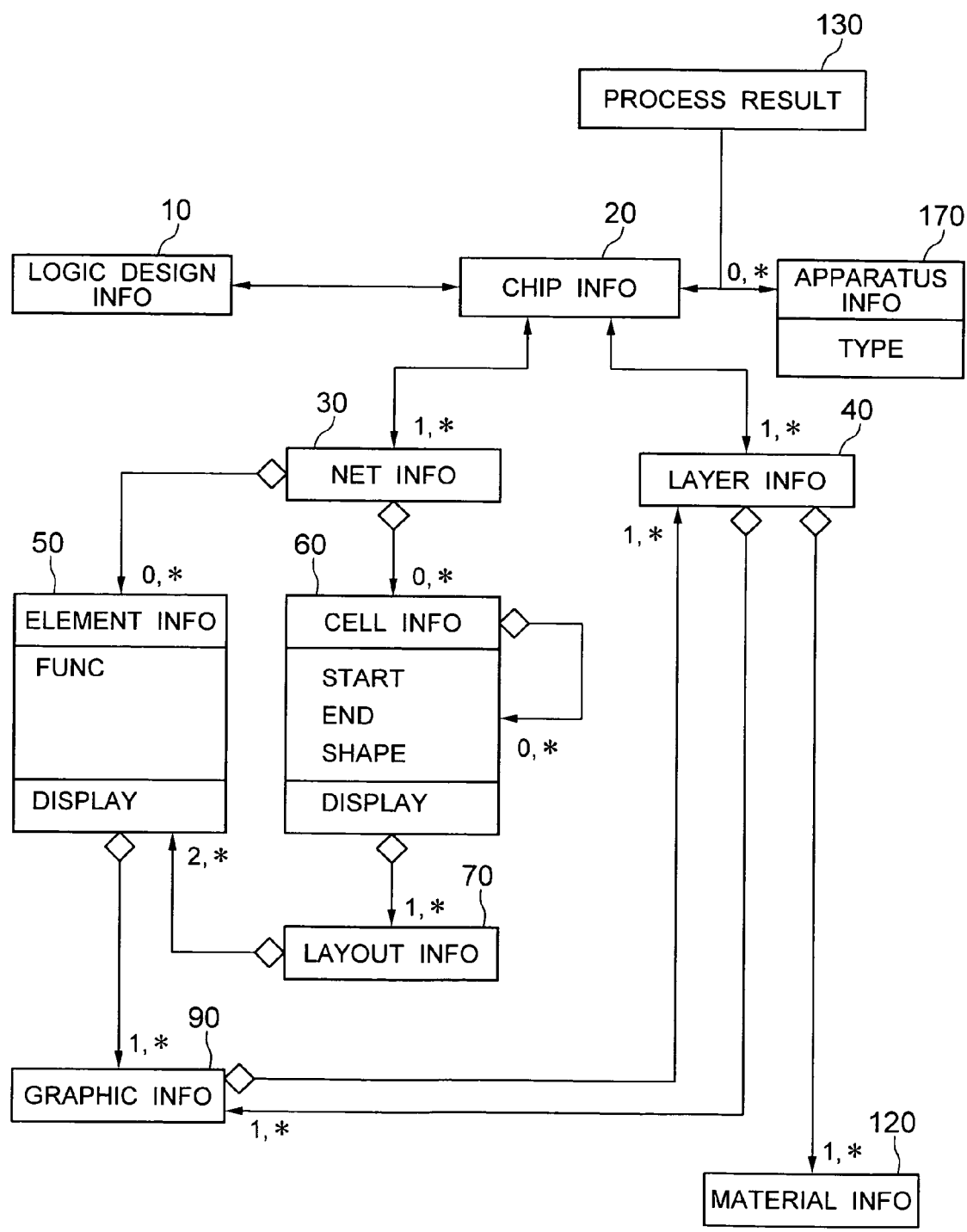
FIG. 2 is a diagram pictorially representing logic information in the form of classes in accordance with the representation rules of UML.

FIG. 2 is a diagram showing, in the form of classes, the logical information in accordance with representation rules of the unified modeling language (UML).

The logic design information 10 is the one that represents request specifications and logic design information and others. An information item concerning a chip corresponding to this logic design information 10 is the chip information 20 (referred to as the chip into in FIG. 2). The chip information 20 is relevant to the net information 30 and layer information 40. The net information in turn is related to the element information 50 and cell information 60 and retains therein certain information as to the interconnection between a plurality of element information items 50 and cell information 60.

The layer information 40 retains therein the relevancy with respect to information concerning respective layers including, but not limited to, diffusion layers and wiring layers in the manufacture of semiconductors. The layer information 40 also retains a relationship with material information 120. The chip information 20 and apparatus information 170 are associated with each other by a processing result 130 of the apparatus.

The cell information 60 is a functional component which is prepared on a per-process basis. This component is realizable by stack or lamination of a plurality of layers and thus is pertinent to more than two items of layer information 140. In addition, this component is also realized by combination of a functional component such as a transistor or the like and a connection component such as a wiring line; thus, it retains layout information 70 containing a layout of more than two items of element information 50 and connection path/routing information thereof. Furthermore, each circuit element has its own shape in reality so that it retains more than two items of graphic information 90 in order to hold the information as to such element shapes. This graphic information 90 retains the bidirectional correlation with the above-noted layer information 40.

With such an arrangement for retaining the information relevancy in this way, it becomes possible, by tracking or "chasing" the relevance of information from the logic design information 10 in the upstream, to thereby make reference to any one of the element information 50 and cell information 60 in the downstream. It becomes also possible to provide adequate manageability of the information as to a cell having a standard function and more than one basic circuit element making up this cell and also the real shape of such element.

In the case of managing circuit elements as a library of mere pictorial arts or graphical drawing components by use of CAD information thereof, it is difficult to manage manufacturing and inspection processes in units of element types. However, by managing, as in this embodiment, the elements by using certain information such as the element information 50 involving element function information and the cell information 50 containing a functional component(s) prepared on a per-process basis by way of example, it is possible to manage the manufacturing and inspection processes thereof in units of types of such elements. For example, it is possible to implement both the optimization of per-type element fabrication and the narrow-down or "screening" of an object to be inspected.

Figure 3:
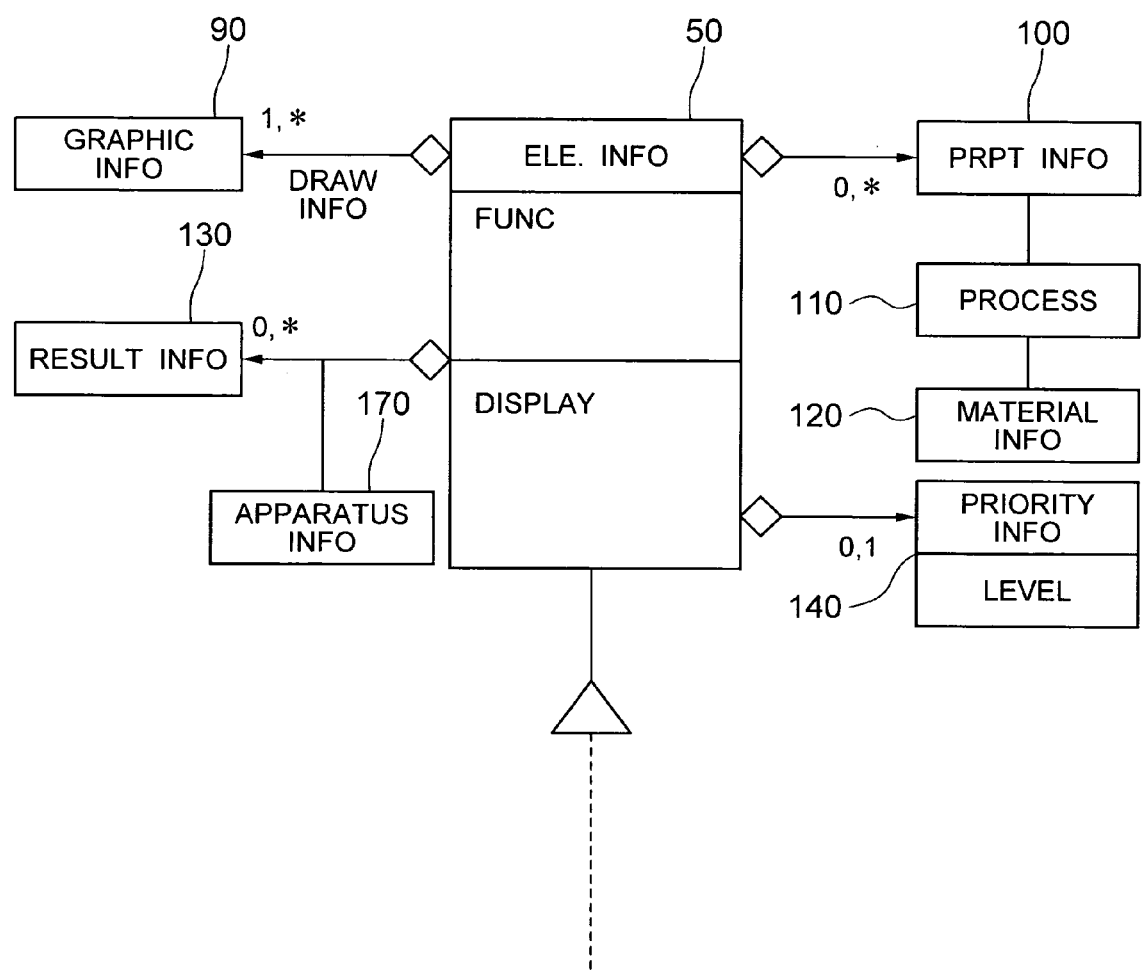
FIG. 3 is a diagram representing, in the form of classes, the correlation of element information which is logic information.

FIG. 3 is a diagram representing, in form of classes, the correlative linkage of element information, which is logic information. The element information 50 is a component for performing a basic operation, which retains the correlation with graphic information 90 concerning the real shape thereof. The element information 50 also retains the correlation with properties information 100 as to the characteristics of the element. Since this properties information 100 is high in process dependency, this information has a relationship with process information 110. Additionally the process information 110 holds the relationship with material information 120. Note that the element information 50 sometimes relates to information items of various apparatuses, it retains the relationship with apparatus information 170. Furthermore, the element information 50 retains the relevancy to priority information 140 of each circuit element.

The element information 50 is in a "parent" class of all the circuit elements concerned. Real elements are such that "child" class components—such as transistors, contacts, wiring lines, vias and pads, not shown, or any equivalents thereto—are in the inheritance relationship. An example is that in regard to the above-noted transistor, the information retains, as its properties information, the correlation with transistor characteristics unique to the transistor. In this case, for use as the transistor characteristics, there are retained certain information items such as device parameters to be used in a model of the simulation program with integrated circuit emphasis (SPICE) or the like.

By retaining the information correlation in this way, it becomes possible to manage the information as to each circuit element and the real shape of this element along with the characteristics of such element. This in turn makes it possible to manage as the graphic information 90 the information on the element—inherent shape and characteristics—for example, both a desired graphic or "caricature" to be drawn at the stage of mask fabrication and a graphic to be drawn while taking account of optical proximity correction (OPC).

Figure 4:
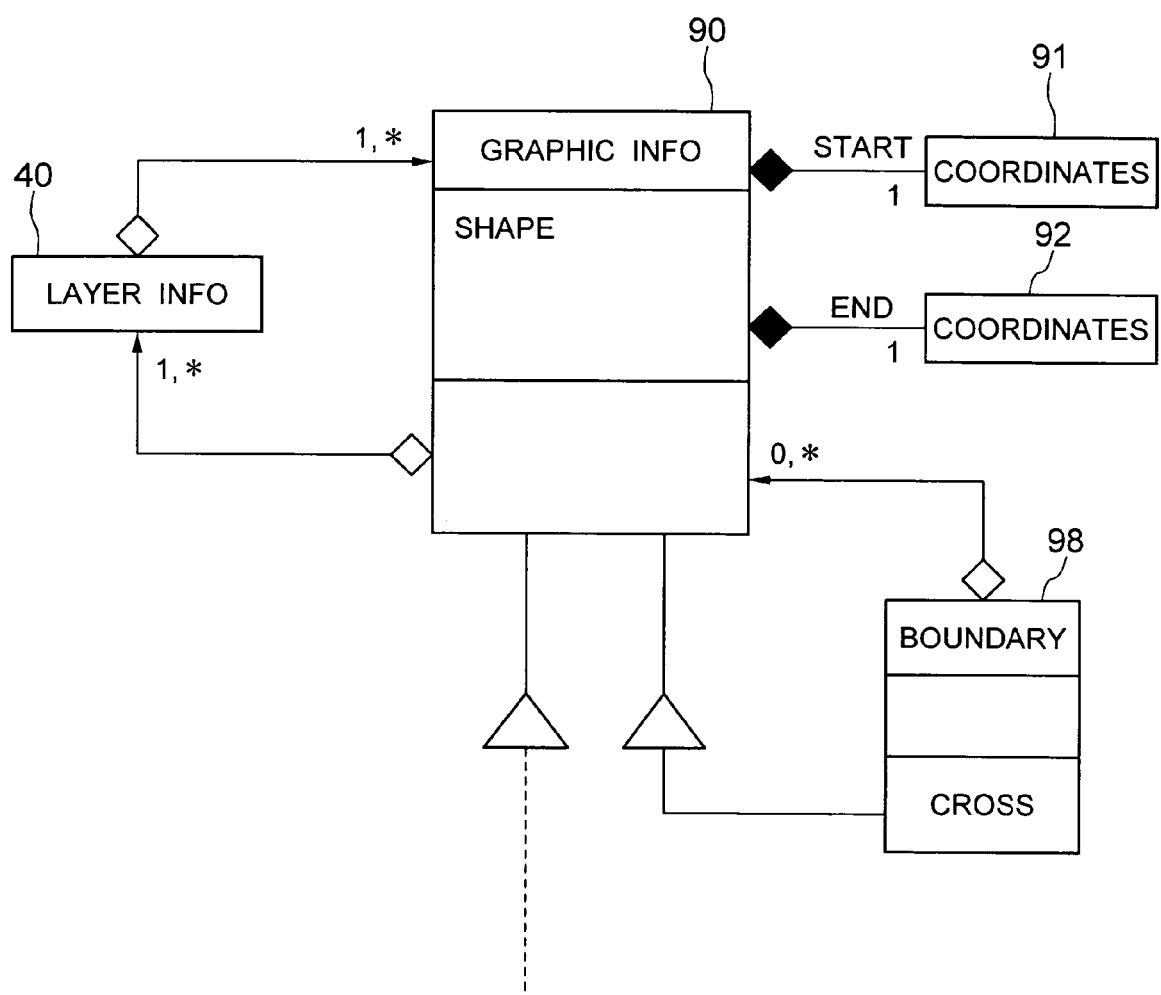
FIG. 4 is a diagram representing, in form of classes, graphic information that is logic information.

FIG. 4 is a diagram representing, in form of classes, graphic information which is logic information. The graphic information 90 is the one that retains information representative of a graphical image or picture, and has coordinates 91 of a start point and coordinates 92 of an end point for indication of at least an external circumscribed region of a graphic. The coordinate point 91 is in a class which holds X and Y coordinate values. Note that the graphic information 90 is in a parent class, whereas a region 98 that is in a child class contains a plurality of graphics.

Also note that the graphic information 90 derives child classes of standard graphic shapes including, but not limited to, a route, polygon, rectangle, sector, ellipse, hollow-core annular doughnut-like shape, dot(s), and trapezoid, although these are not specifically depicted herein. The route has information of a style, such as width and end point shape or the like, and retains the correlation with the information of coordinates 91 of two points corresponding to the start and end points of a single line segment. The polygon has the information of a style such as a fulfillment form, and holds the relevancy to information of three coordinate points equivalent to a triangle. The rectangle has the information of a style such as fulfillment form in a similar way to the polygon. The sector or ellipse has the information of start and end angles. The doughnut has an outer radius that is the radius of an external circle and also an inner radius that is the radius of an internal circle. The dot(s) is/are the form with the pattern of rectangle being fixed. The trapezoid has the relevancy to two coordinates indicative of its short side. By managing the graphics information while applying abstraction thereto in this way, it becomes possible to simplify the handling of information. This makes it possible to achieve send-and-receive or "interexchange" of information without depending upon the format of CAD data or else.

Figure 5:
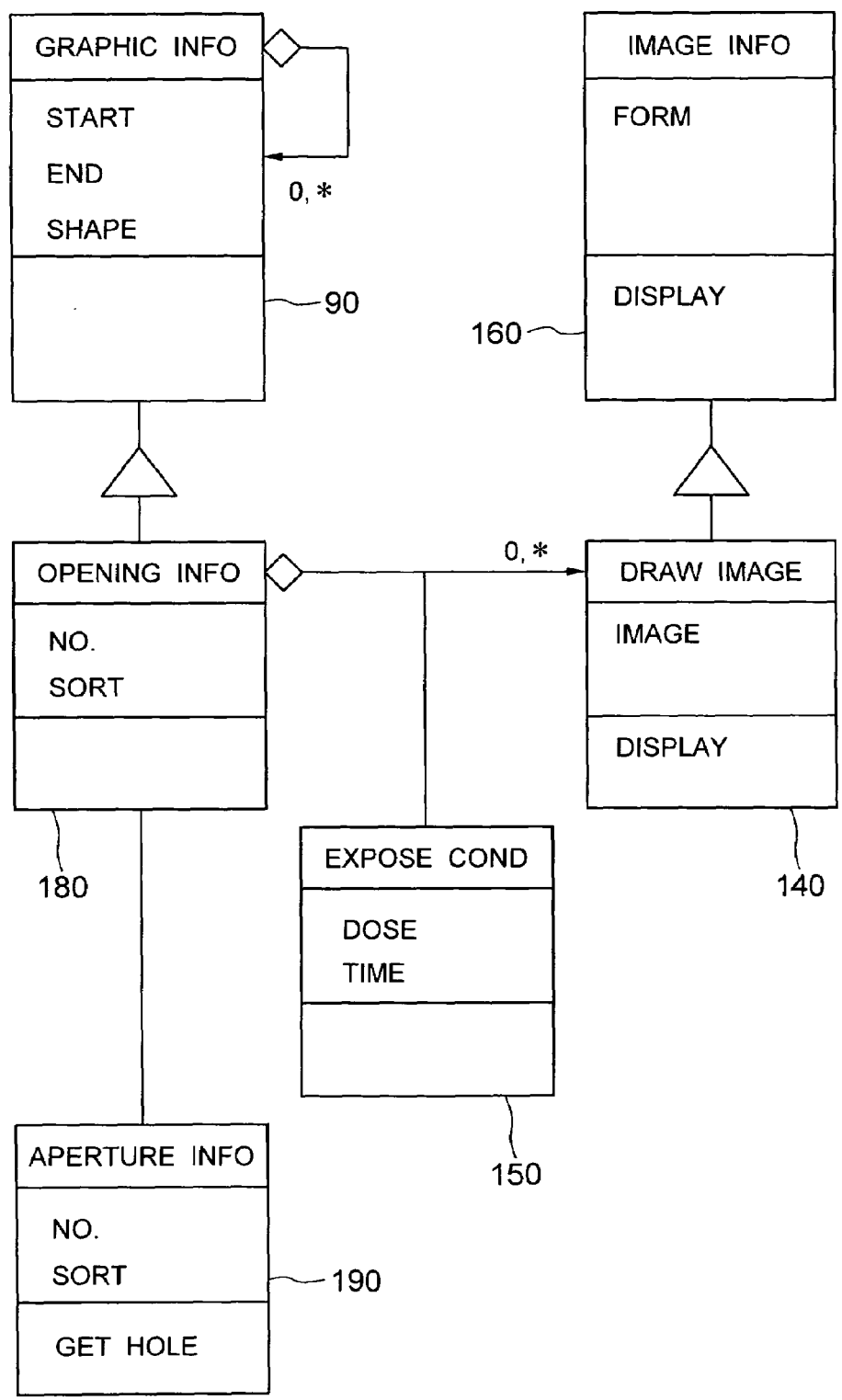
FIG. 5 is a diagram representing, in form of classes, the correlation of graphic information and image draw information or else which is logic information.

FIG. 5 is a diagram representing, in class form, the correlation of the graphic information and image draw information or the like, each being logic information. FIG. 5 shows the relevancy of certain information items which follows: graphics information, opening information of either an electron beam mask drawing apparatus or an electron beam direct drawing apparatus, image information of a mask inspection apparatus for inspection or testing of the drawing result of the apparatus, and image information of a wafer inspection apparatus for inspection of the processing result of a stepper using the mask.

The opening information 180 is a derived class of the graphic information 90. The opening information 80 has information, such as numerals or else, for providing correspondence with real openings. In view of the fact that a plurality of openings are present in a substrate called the aperture, aperture information 190 retains the correlation with such multiple items of opening information 180 in order to simulate or "modelize" this relationship. Each opening information 180 retains the correlation with the aperture information 190. The opening information 180 also retains the relationship with respect to a drawn image 140, which is the result of a test depiction under irradiation conditions 150. The draw image 140 is a child class of the image information 160.

By retaining the opening information 180 and the test depiction results with the use of the opening, it becomes possible to compare the draw image that is the real drawing result of the apparatus with the above-noted test depiction image. This makes it possible to readily perform extraction of any image draw defects due to the opening.

Figure 6:
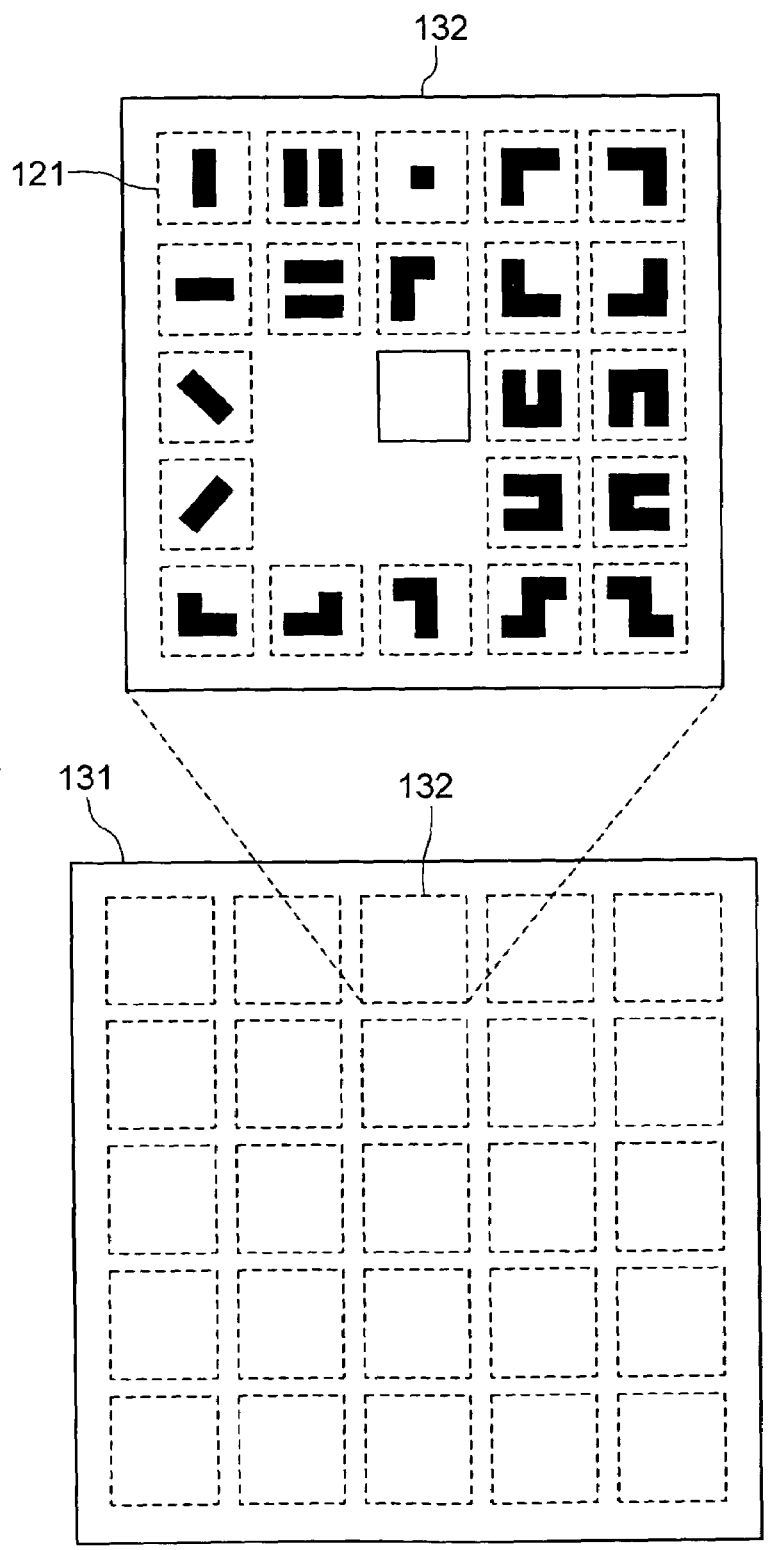
FIG. 6 is a diagram showing an aperture structure and several exemplary openings.

FIG. 6 is a diagram showing an aperture plate 131 and an exemplary pattern of openings. The aperture 131 that corresponds to the aperture information 190 has a plurality of aperture categories 132, including a plurality of openings 121–128.

Next, an explanation will be given of processing procedures in a semiconductor manufacturing apparatus and an inspection apparatus.

Figure 7:
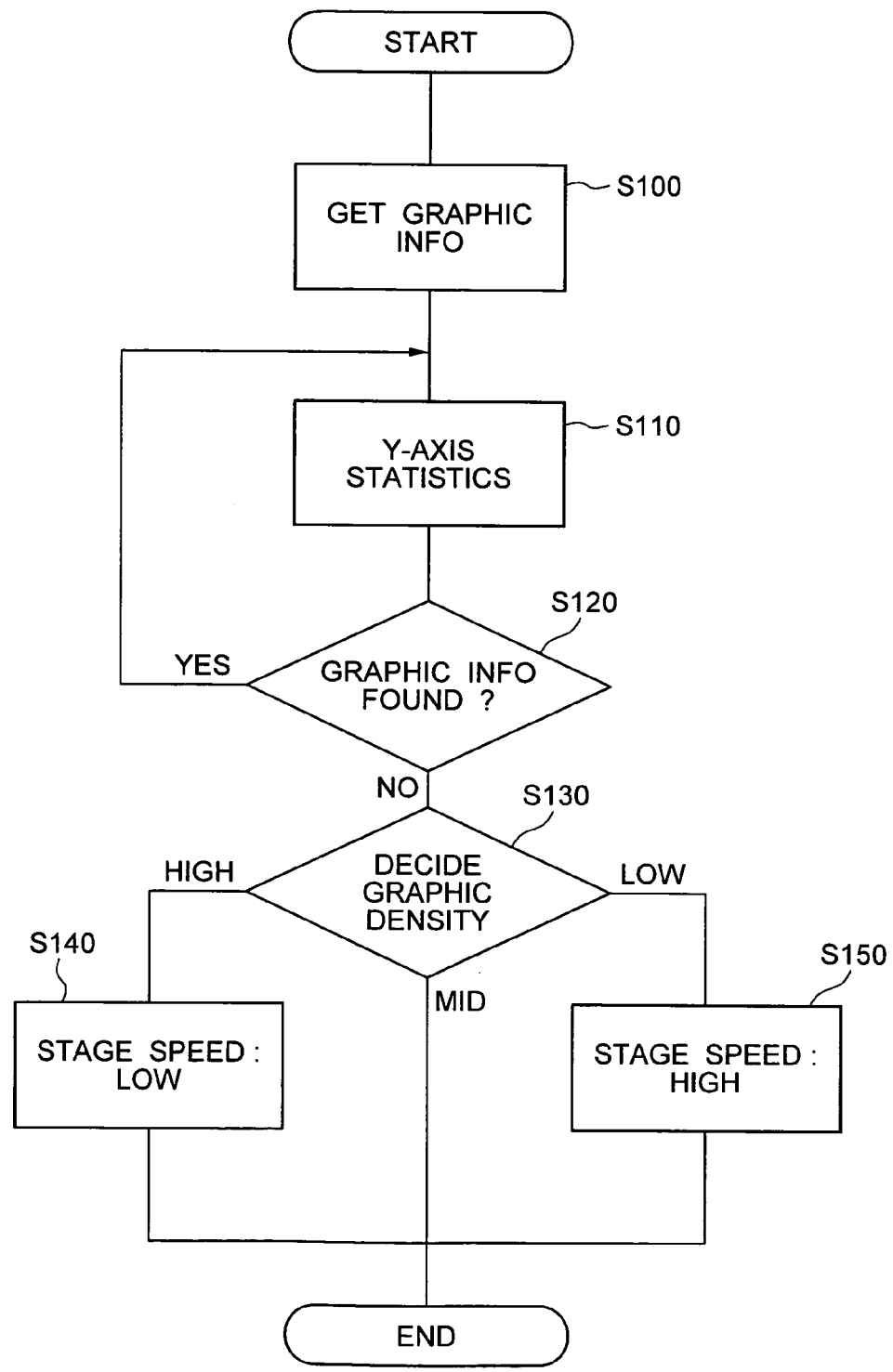
FIG. 7 is a diagram for explanation of an example which provides variable controls over the stage speed of an image drawing device in a way pursuant to graphics density.

FIG. 7 is a diagram for explanation of an example which provides variable control of the stage moving speed of an image drawing apparatus in accordance with the density of a graphic. By making the stage speed variable in accordance with the density of a graphic being present within an image draw region, it is possible to adjust the drawing speed.

The drawing apparatus acquires an instance of the graphic within an image drawable region (at step 100 of FIG. 7). The instance of graphic information is obtainable based on the relationship between the chip information 20 and layer information 40 of FIG. 2 and also based on the correlation of the layer information 40 and graphic information 90. Next, compute the density of a graphic in a stage moving direction (Y axis) (at step 110). This graphics density computation will be performed until no other instances are found (step 120), followed by determination or "judgment" of the graphics density (step 130).

In case the resulting graphics density is high, slow the state moving speed (at step 140). When the graphics density is low, fasten the stage move speed (step 150). If no appreciable changes are found in graphics density, then maintain a present stage move speed. By adjusting the stage move speed in this way, it is possible to improve the throughput while at the same time attaining sufficiently increased accuracy of graphical images at locations high in graphics density.

Figure 8:
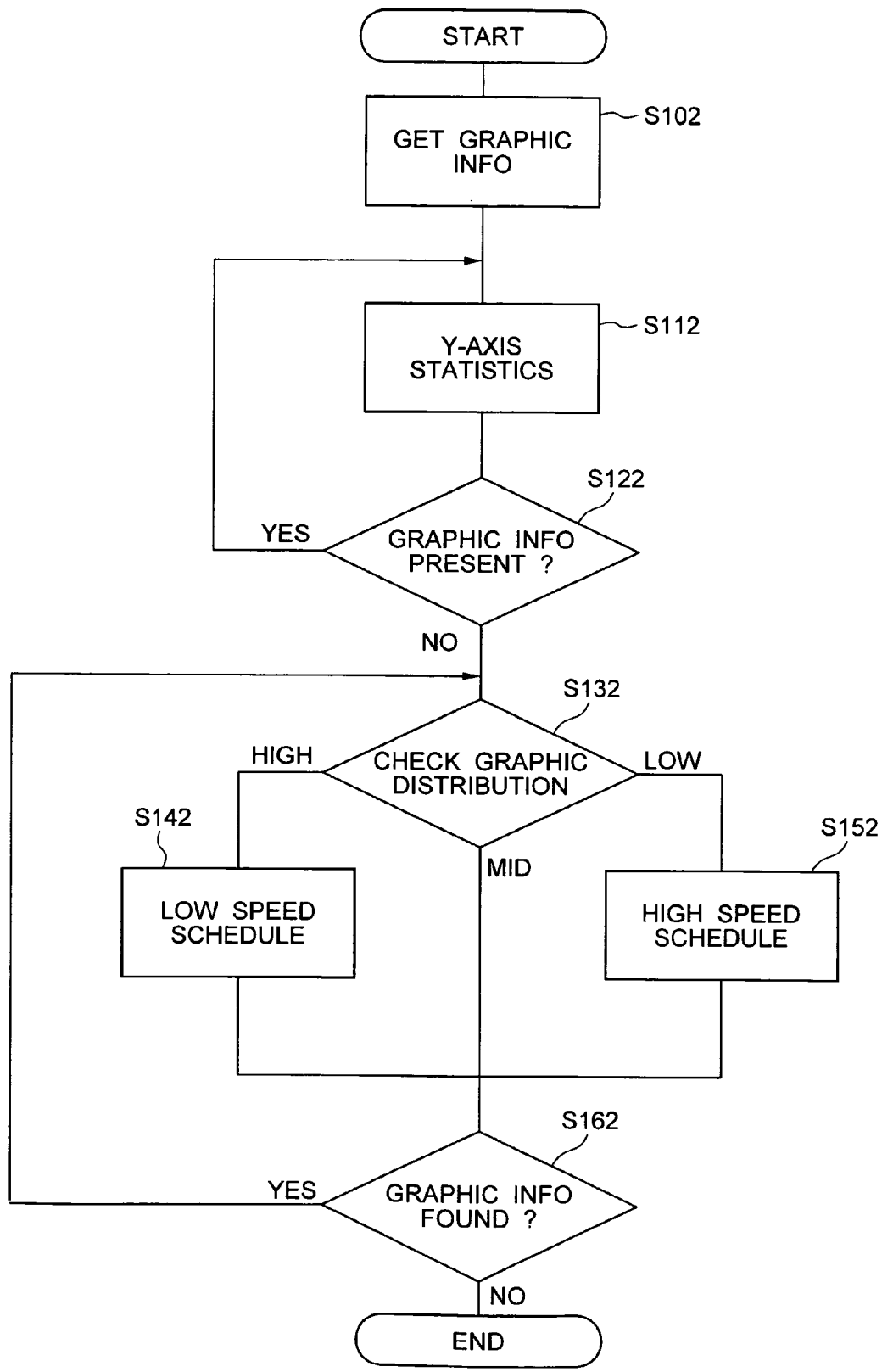
FIG. 8 is a diagram for explanation of an example for scheduling the stage speed in accordance with the graphics density.

FIG. 8 is a diagram for explanation of an example which performs the scheduling of the stage speed in a way conformity with the graphics density. As shown herein, perform the stage speed scheduling in response to the density of one or more graphical images that are present within a drawing region. The drawing apparatus is such that there is an image draw unit, called the stripe, with its stage move length being the longest one and with a drawing width becoming maximal.

Firstly, acquire an instance of graphic information of this stripe region (at step 102 of FIG. 8). Then, compute a graphic distribution in the stage moving direction (Y axis) (at step 112). Such graphics density computation will be done until no further instances are found (step 122). Next, explore and search for a distribution of graphics density in the Y-axis direction (step 132). At a position low in graphics density, set the stage move schedule at a level of high speed (step 142). At a position low in graphic density, set it at a low speed level (step 152).

Continue to set up the stage move schedule on a per-instance basis until any other instances of graphics information are no longer present (step 162). By setting up the move schedule in this way, it is possible to presume or "guess" the throughput and the accuracy of image drawing on the basis of the schedule thus set up. Additionally, if there is a problem in the throughput and accuracy, then it is possible to alter or update the schedule prior to execution of the image drawing.

Figure 9:
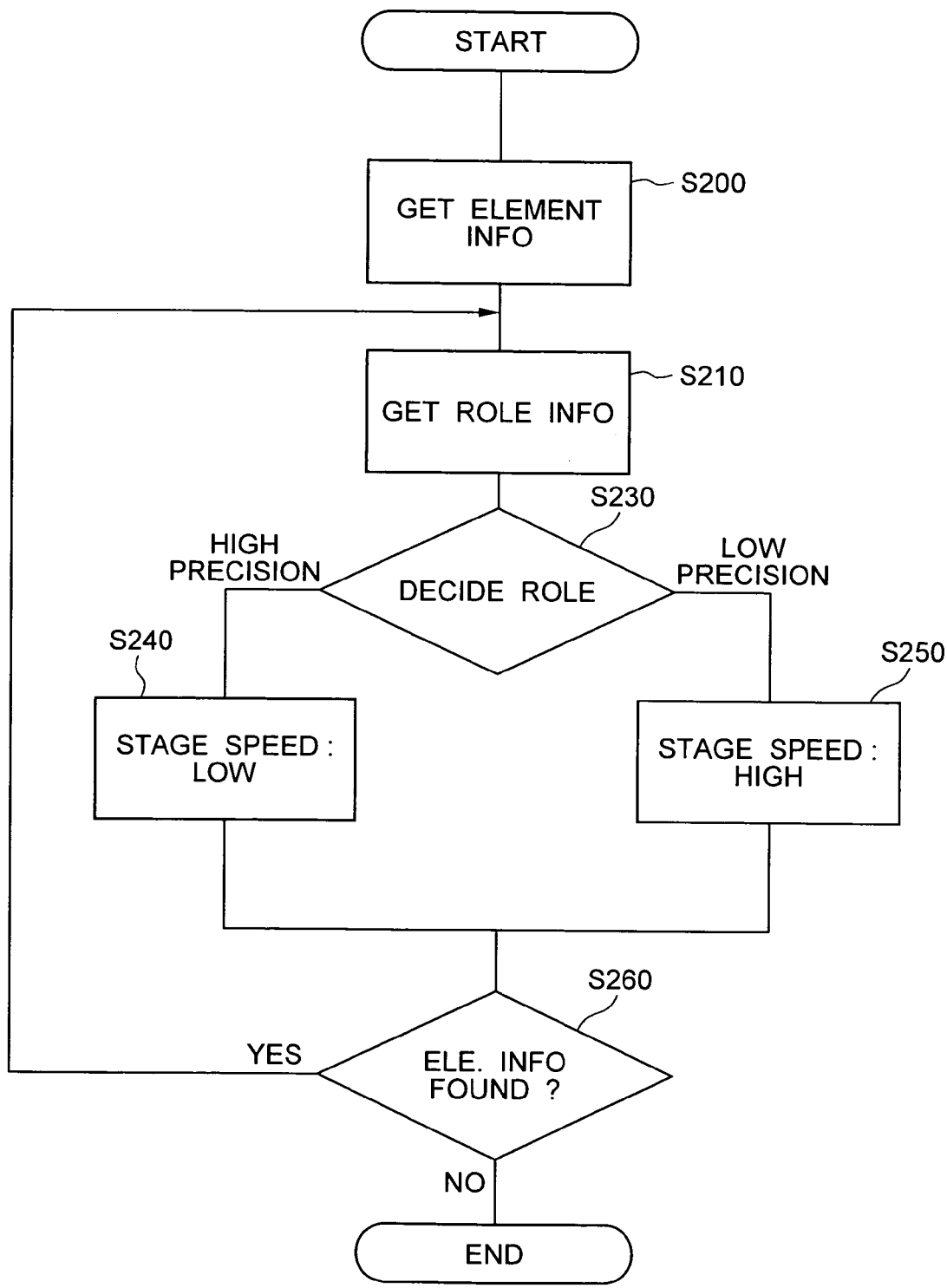
FIG. 9 is a diagram for explanation of an example which makes the stage speed variable in response to the role of an element or elements existing within an image draw region.

FIG. 9 is a diagram for explanation of an exemplary technique for making the stage speed variable in accordance with the functions or "roles" of circuit elements that exist within the image draw region of interest. By making the stage speed variable in accordance with the roles of elements residing within the draw region, it is possible to adjust the drawing speed.

The drawing apparatus acquires an instance of element information of more than one element existing within a drawable region (at step 200). Then, acquire an instance of element role information (step 210). Next, determine or "judge" the role of element (step 220). The role is acquirable from the function member data of element class 50. Based on the element role, judge the accuracy of image drawing required. In the case of an element that is not required to have high precision, such as for example a dummy pad, let the stage moving speed increase (step 250). Alternatively, in the case of an element under strict requirement for high accuracy, such as for example the gate of a transistor, slow the stage speed (step 240). The processing above will be repeated until no other element information instances are found (step 260).

By making the stage speed variable in accordance with the roles of elements to be drawn in this way, it is possible to improve the throughput. In addition, regarding high precision-required elements, it is possible to retain the accuracy thereof at high levels.

Figure 10:
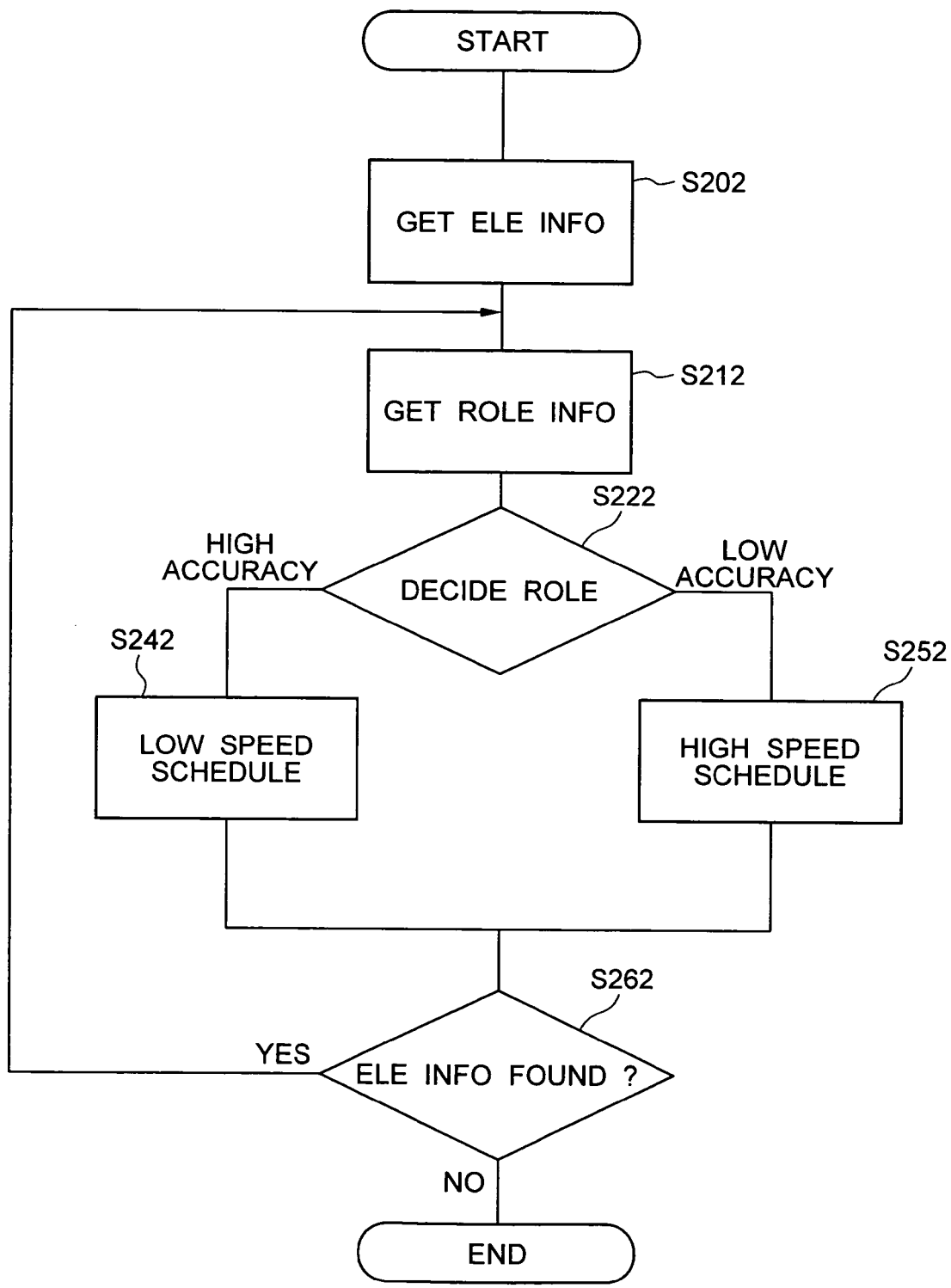
FIG. 10 is a diagram for explanation of an example for scheduling the stage speed in accordance with the role of an element(s) residing within an image draw region.

FIG. 10 is a diagram for explanation of an example which performs the scheduling of the stage speed in accordance with the roles of one or more circuit elements that are present within a drawing region. First, the drawing apparatus acquires an instance of element information of the stripe region stated previously (at step 202), and then acquires an instance of role information of each element along the stage moving direction (step 212). Then, based on the element role information thus obtained, judge the role of each element (step 222).

At the position of a graphic corresponding to an element under requirement for high precision, set the stage move speed at a low speed level (step 242). At the position of a graphic form corresponding to an element free from the high precision requirement, set the stage move speed at a high speed level (step 252). The above-noted processing will be repeated until no further instances of element information are found (step 262).

In this way, it is possible to make the schedule of the moving speed in a way conformity with the role of each element. It is also possible to presume in advance the throughput and the accuracy based on the schedule thus prepared. Owing to this feature, in case where there are problems in the throughput and accuracy, it is possible to modify or update the schedule that was created prior to image drawing.

Figure 11:
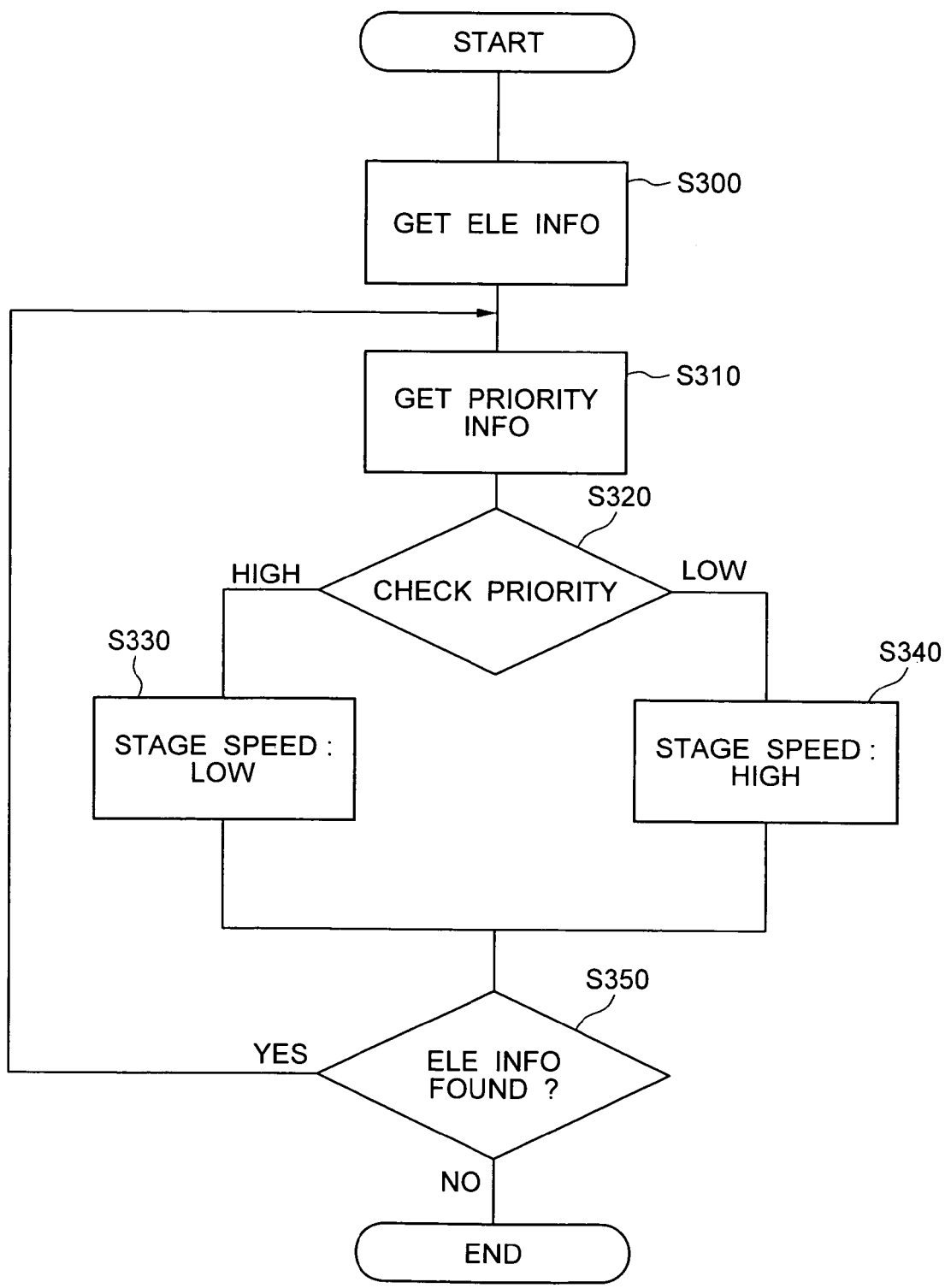
FIG. 11 is a diagram for explanation of an example which makes the stage speed variable in conformity with the priority of an element(s).

FIG. 11 is a diagram for explanation of an example which makes the stage speed variable in accordance with the priority (level of importance) of an element. By varying the stage speed in accordance with the element priority, it is possible to adjust the image drawing speed.

The drawing apparatus acquires an instance of an element within a drawable region (at step 300). Then, get an instance of priority information of such element (step 310). The priority is obtainable from the level member data of the priority class 120. Next, judge the priority (step 320). In case the element priority is high—for example, in case where the element of interest is the gate of an element for creation of a reference voltage—set the stage moving speed at a low speed level (step 330). In the case of the element priority is low, set the stage moving speed at a high speed level (step 340). This processing will be repeated until the depletion of any element information instances (step 350). By varying the stage moving speed in accordance with the priority of element in this way, it is possible to improve the throughput while simultaneously enabling execution of image drawing with its accuracy or precision pursuant to the element priority.

Figure 12:
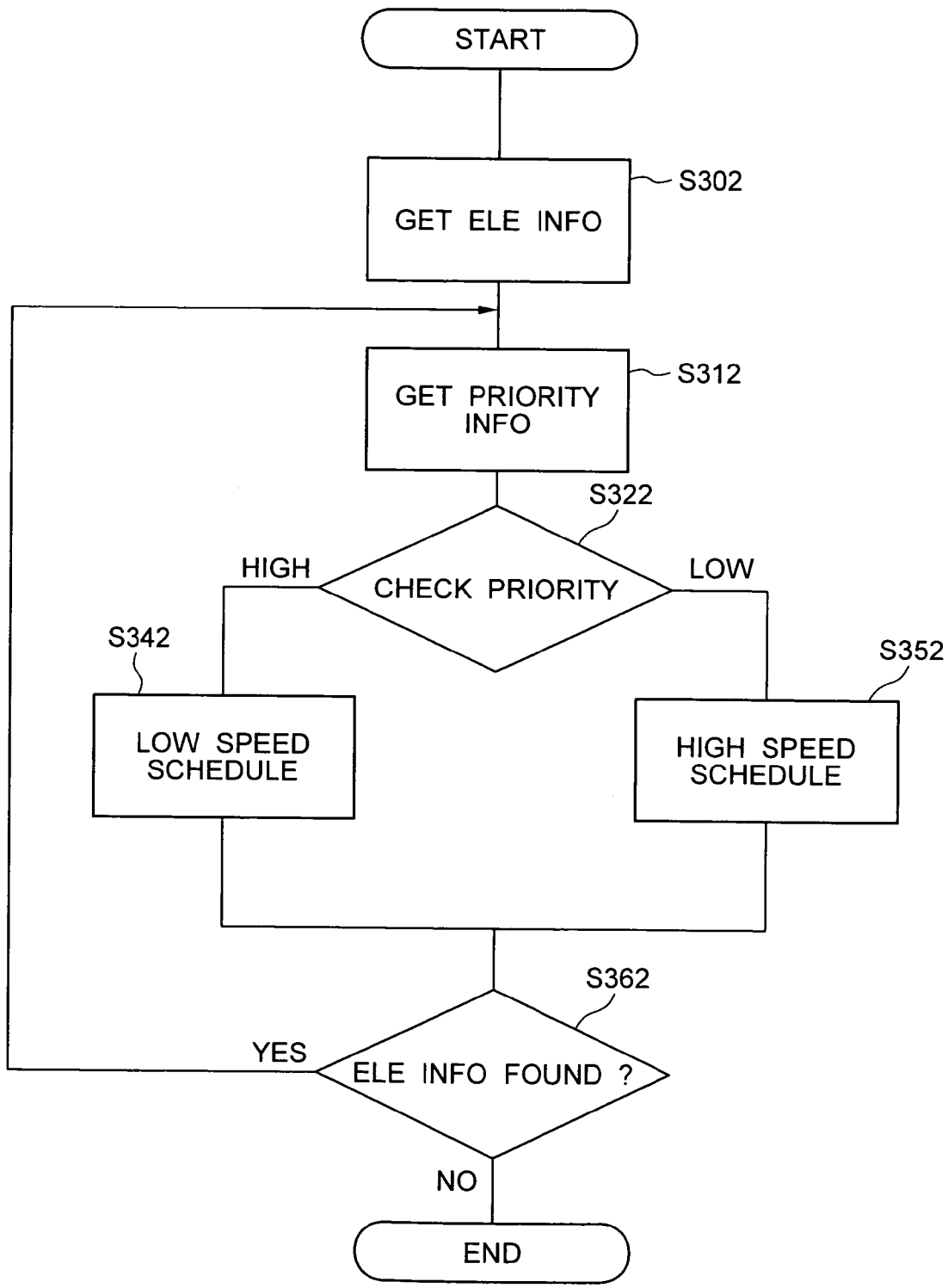
FIG. 12 is a diagram for explanation of an example for scheduling the stage speed in accordance with the priority of an element(s).

FIG. 12 is a diagram for explanation of an example which performs the scheduling of the stage speed in accordance with the priority (level of importance) of an element. First, the drawing apparatus acquires an instance of element information in the stripe region stated supra (step 302). Then, acquire an instance of priority information of each element along the stage movement direction (step 312). Next, judge the priority (step 322); then, in accordance with the element priority thus judged, set the stage operation schedule to a low speed level at the position of a graphic corresponding to an element high in priority (step 342). At the position of a graphic corresponding to the element low in priority, set the stage move speed at a high speed level (step 352). This processing will be repeated until any other instances of element information become absent (step 362).

In this way, it is possible to achieve the scheduling of the stage speed in accordance with the element priority (level of importance). It is also possible to presume in advance the throughput and the accuracy based on the schedule thus prepared. Also importantly, in cases where there are problems in the estimated throughput and accuracy, it is possible to modify the schedule prior to start-up of image drawing.

Figure 13:
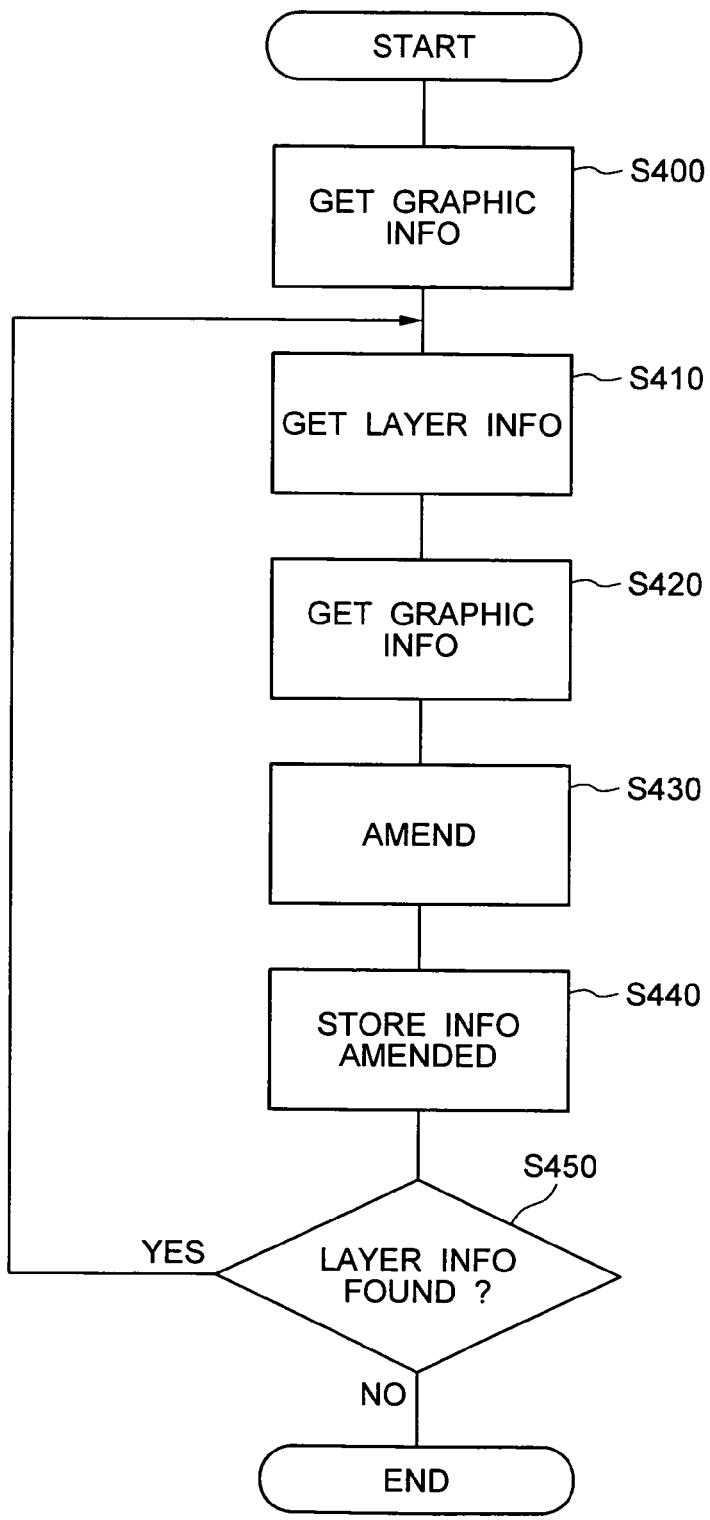
FIG. 13 is a diagram for explanation of a processing procedure which applies modification to mask data based on the graphic information of a plurality of semiconductor layers ("layers").

FIG. 13 is a diagram for explanation of a system routine for modifying or "amending" mask data on the basis of graphics information of a plurality of semiconductor layers ("layers"). First, acquire an instance of graphics information of a layer to be modified (at step 400). Then, acquire an instance of layer information of another layer (step 410); further, get an instance of graphic information of another layer (step 420). Next, perform modification based on the graphic information of the to-be-modified layer and the graphic information of the another layer (step 430); then, store the modified information (step 440). Modification will be done with respect to all of a number of layers required for execution of this processing (step 450).

By modifying the mask data based on the graphic information of a plurality of semiconductor layers ("layers") in this way, it is possible to suppress or avoid the influence due to transmission and reflection of electrons in electron beam drawing equipment, by way of example.

Figure 14:
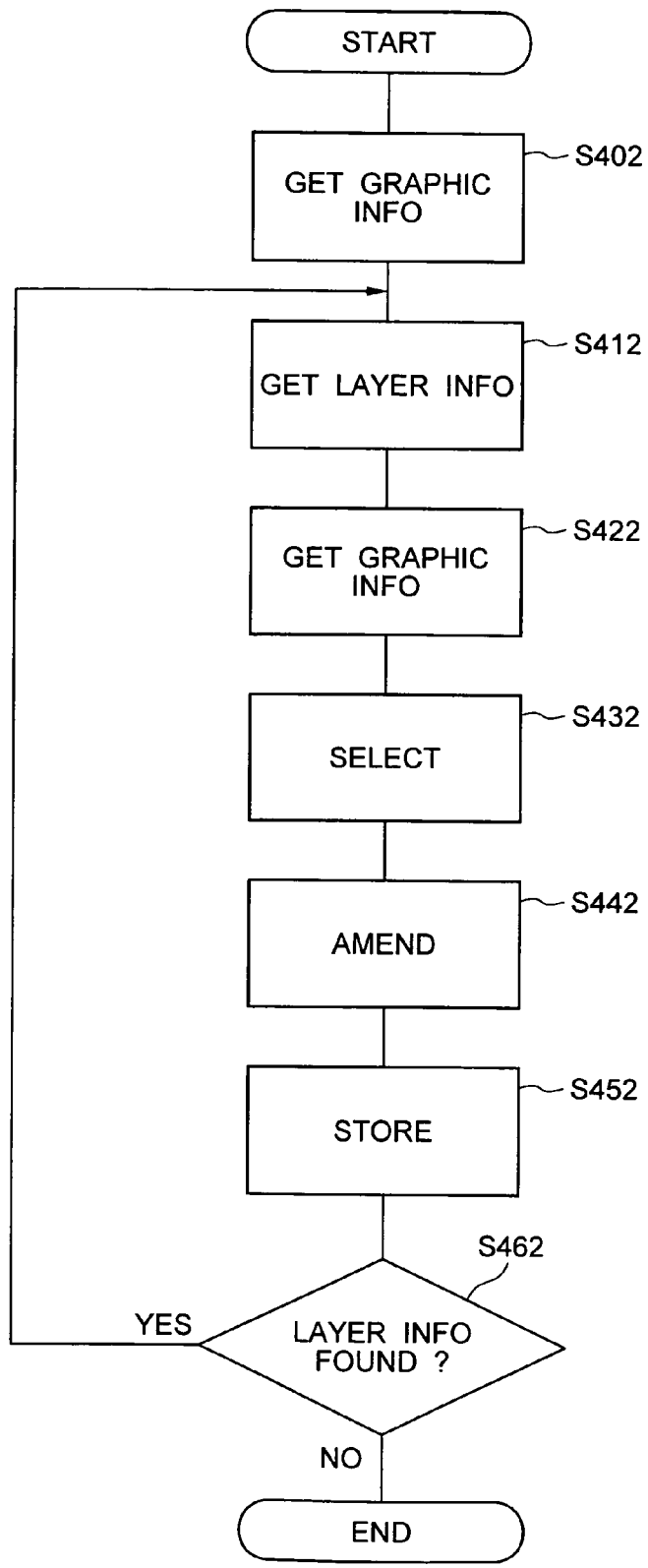
FIG. 14 is a diagram for explanation of a processing routine for modifying the mask data based on the area of a graphic form as detected based on the information of a plurality of semiconductor layers and also an overlap of graphics.

FIG. 14 is a diagram for explanation of the processing that applies modification to mask data on the basis of the area and overlap of a graphic as detected based on the information of a plurality of semiconductor layers. First, acquire the information of a layer to be modified (at step 402). Then, obtain an instance of layer information of another layer (step 412); further, get an instance of graphic information of another layer (step 422). Next, select the instance of a graphic which is present either in a region that overlaps the graphic of the to-be-modified layer or in a nearby region with influence ability to the graphic of the to-be-modified layer (step 432). Then, modify or "amend" the mask data based on the correlation of the area of an overlapping portion of the another layer thus selected and a layer film thickness (step 442). Thereafter, store the modified information (step 452). This process will be performed with respect to any necessary number of layers that require the processing above (step 462).

By limiting the graphic as to modification only to a graphical image that resides either in the region overlapping the graphic of a to-be-modified layer or in the nearby region with the influence ability to the graphic of the to-be-amended layer in this way, it is possible to shorten a time taken to execute the modification computing processes.

Figure 15:
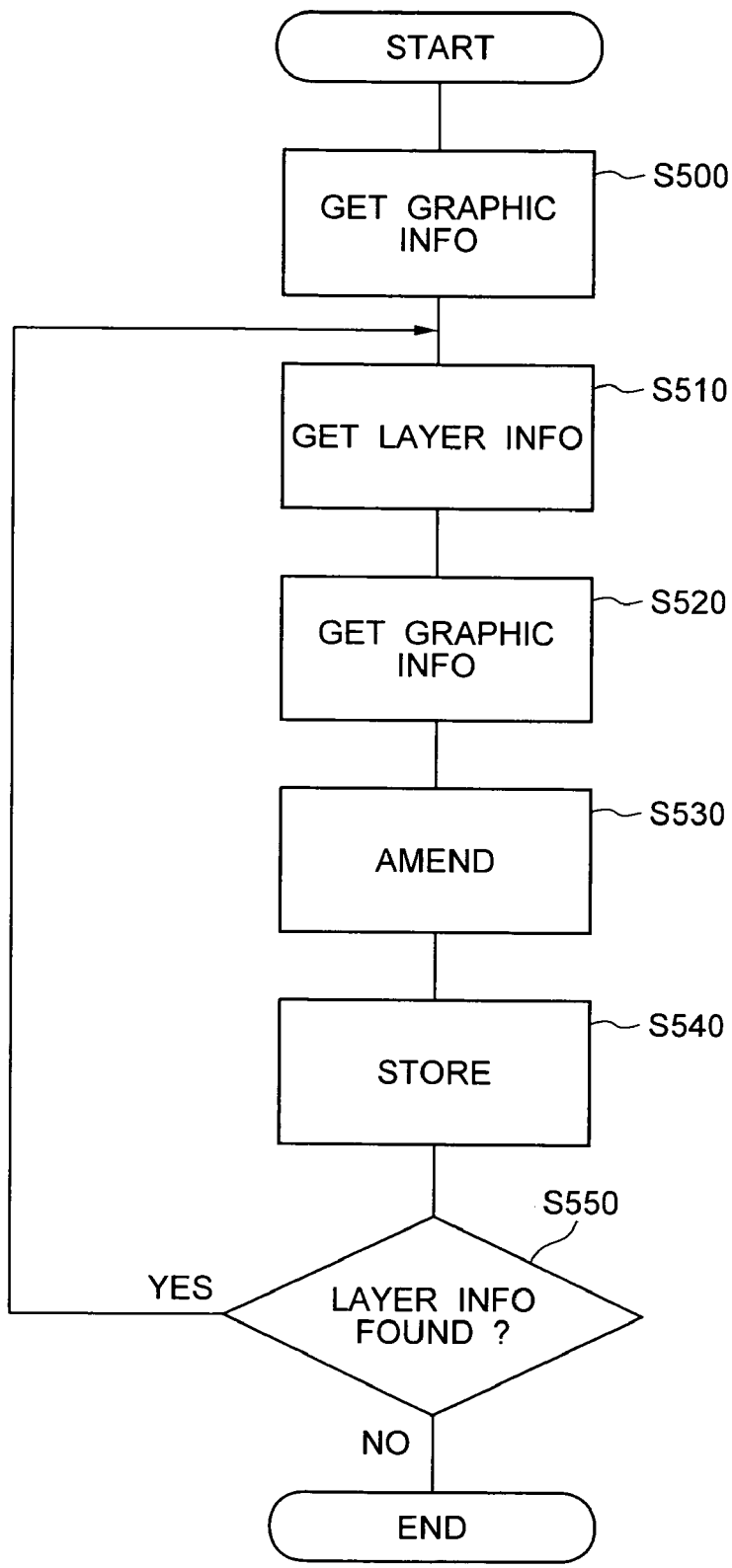
FIG. 15 is a diagram for explanation of a processing routine for performing modification based on the material information of a material composing each layer of a plurality of semiconductor layers.

FIG. 15 is a diagram for explanation of the processing that performs modification based on the material information of a material composing each of a plurality of semiconductor layers. Firstly, acquire an instance of the element information of a layer to be modified (at step 500). Then, obtain an instance of layer information of another layer (step 510); further, get an instance of material information of another layer (step 520). Next, perform modification or "amendment" based on both the material information of the to-be-modified layer and the material information of the another layer (step 530). Then, store the modified information (step 540). This processing will be performed with respect to a number of layers required (step 540).

In this way, it is possible to perform appropriate modification in a way pursuant to the material of each layer. Owing to this, it is possible to take into consideration the influence due to transmission and reflection of electrons in the electron beam drawing apparatus, for example. This makes it possible to improve the accuracy of the modifying processes.

Figure 16:
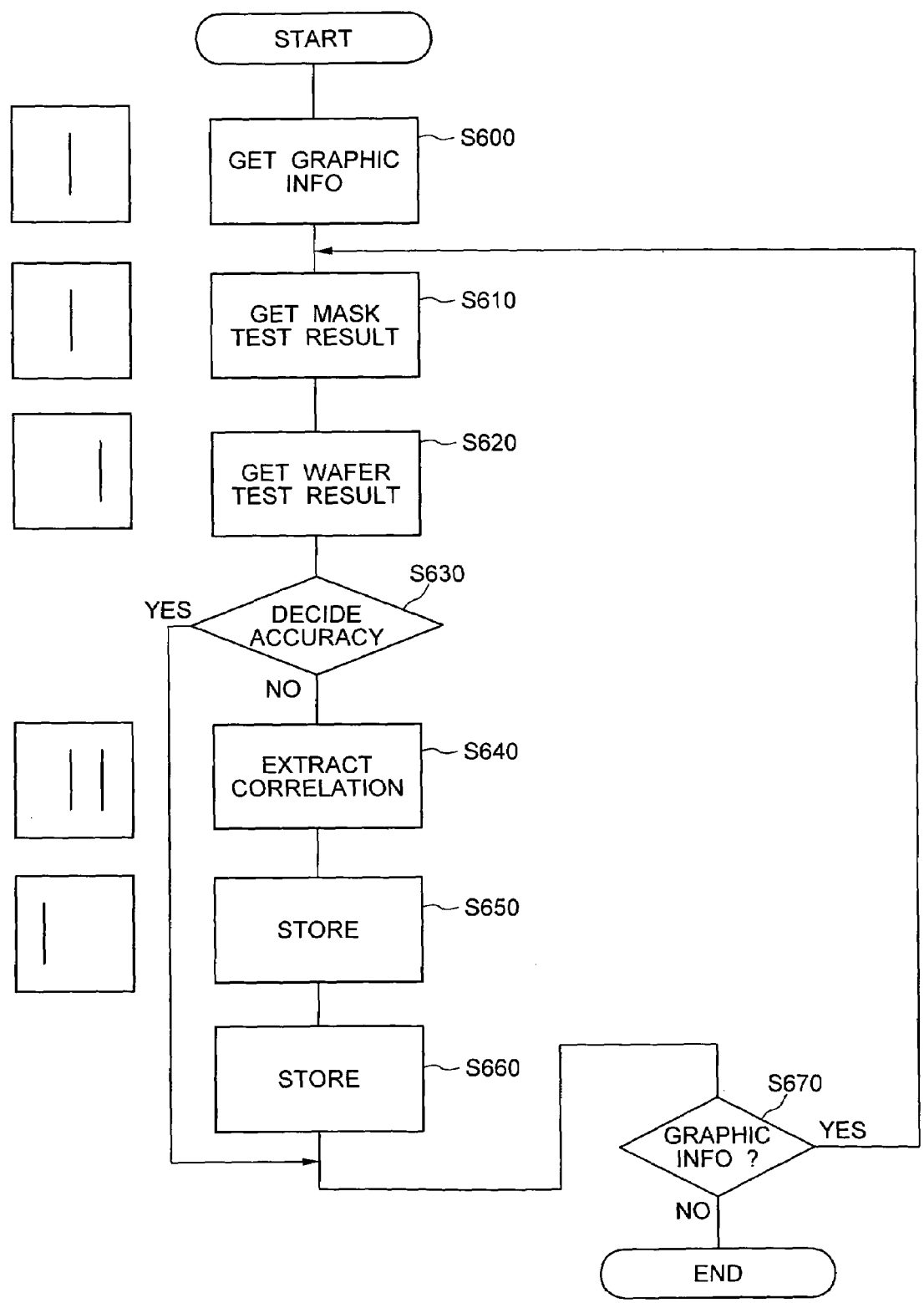
FIG. 16 is a diagram for explanation of an example which acquires an instance of a test result and then applies modification or "amendment" to image draw data based on the instance thus acquired.

FIG. 16 is a diagram for explanation of an example which acquires an instance of inspection result and then apply modification to image draw data based on the instance thus obtained. In FIG. 16, the process routine as shown herein exemplifies the case of using a mask-use electron beam drawing apparatus for manufacture of a mask, a mask inspection apparatus for testing the mask, an exposure apparatus for performing exposure by using the mask, and a wafer inspection apparatus for inspecting a wafer on which a pattern of the mask is transferred or "printed."

First, acquire an instance of graphics information (at step 600). Obtain a mask inspection/test result corresponding to the graphic information (step 610). In the illustrative example, it is apparent from viewing the left-side part of flow chart that no deviance is present between the mask test result and the graphic information. Then, get a wafer test result corresponding to the graphic information (step 620). In the example shown herein, it can be seen that the wafer test result is offset rightward than the graphic information. Based on the graphic information and the mask test result along with the wafer test result, determine or "judge" whether a present setup value falls within an allowable range of the accuracy (step 630). If it is out of the allowable range, then derive the correlative relationship among the graphic information and the test result plus the wafer test result (step 640). In the illustrative example, the deviation or offset of a graphic is obtained as a vector with its magnitude of a constant value and with its direction facing rightward. Next, based on this correlation, apply modification to the graphic information (step 650). In this example, in order to modify or amend the deviation vector, shift the graphic information toward the opposite direction—that is, to the left. Next, store the information thus modified (step 660). The above processing will be repeated as long as any graphics are present (step 670).

By applying modification to the image draw data in this way, it is possible to permit any defects in the exposure apparatus such as stepper equipment or else to be fed back to the instance of the graphic information, which is the processing on the upstream side. Note here that although feedback is done to the graphic information in the example shown in FIG. 16, it is also possible to perform such feedback up to far proceeding information, i.e., logic design information, after having gone back thereto. By giving the feedback in this way, it is possible to achieve adequate data correction or rectification in accordance with differences in machine type between the apparatuses involved.

Figure 17:
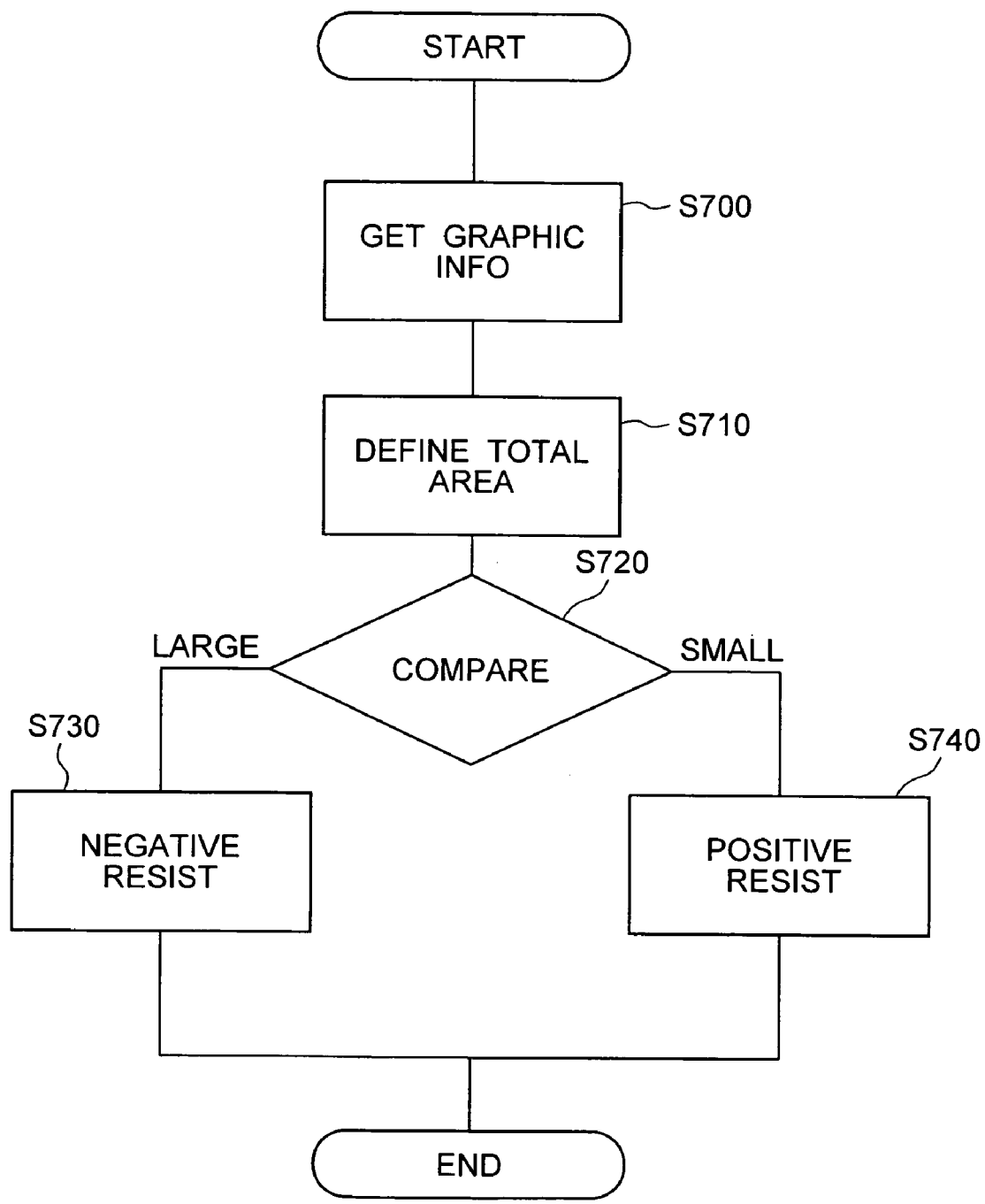
FIG. 17 is a diagram for explanation of a processing routine for selecting the kind of a resist based on graphics information.

FIG. 17 is a diagram for explanation of the processing which selects the kind of a resist based on the graphics information. Firstly, acquire one or more graphical forms within the region of interest (at step 700). Then, calculate a total area of such graphics (step 710). Determine a difference between the area of an image draw region and the total area of graphics (exposure area) and then compare the difference with the total graphic area (step 720). If the total graphic area is larger, then select a negative resist (step 730). Alternatively if the total graphic area is less then select a positive resist (step 740). This makes it possible to reduce the exposure area.

Figure 18:
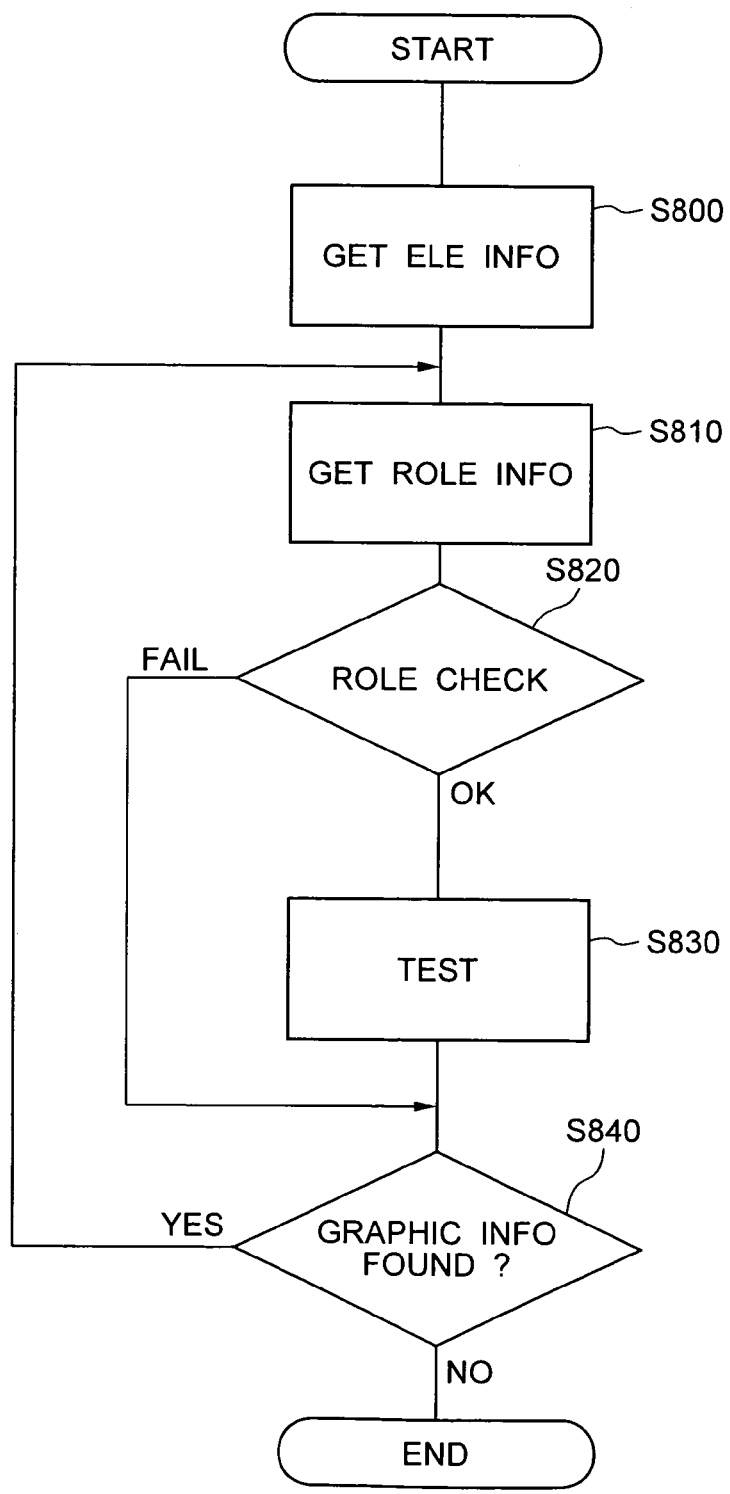
FIG. 18 is a diagram for explanation of a processing routine for determining, based on element information, whether this element is subjected to inspection.

FIG. 18 is a diagram for explanation of the processing that determines based on the element information whether the element is to be inspected or not. In the example shown herein, the process is to judge whether the testing is done in accordance with the role (usage) of the element to be tested. First, acquire an instance of element information within the region under test (at step 800). Then, get an instance of role information of the element information (step 810). Next, determine whether the role information coincides with preset conditions (step 820). An example is that in the case of a dummy pad, no testing is done; in the other cases, execute testing (step 830). The processing above will be repeated until no further instances of element information are found (step 840).

By narrowing candidates for the to-be-tested object in accordance with the role, it becomes possible to improve the throughput of the test/inspection process.

Figure 19:
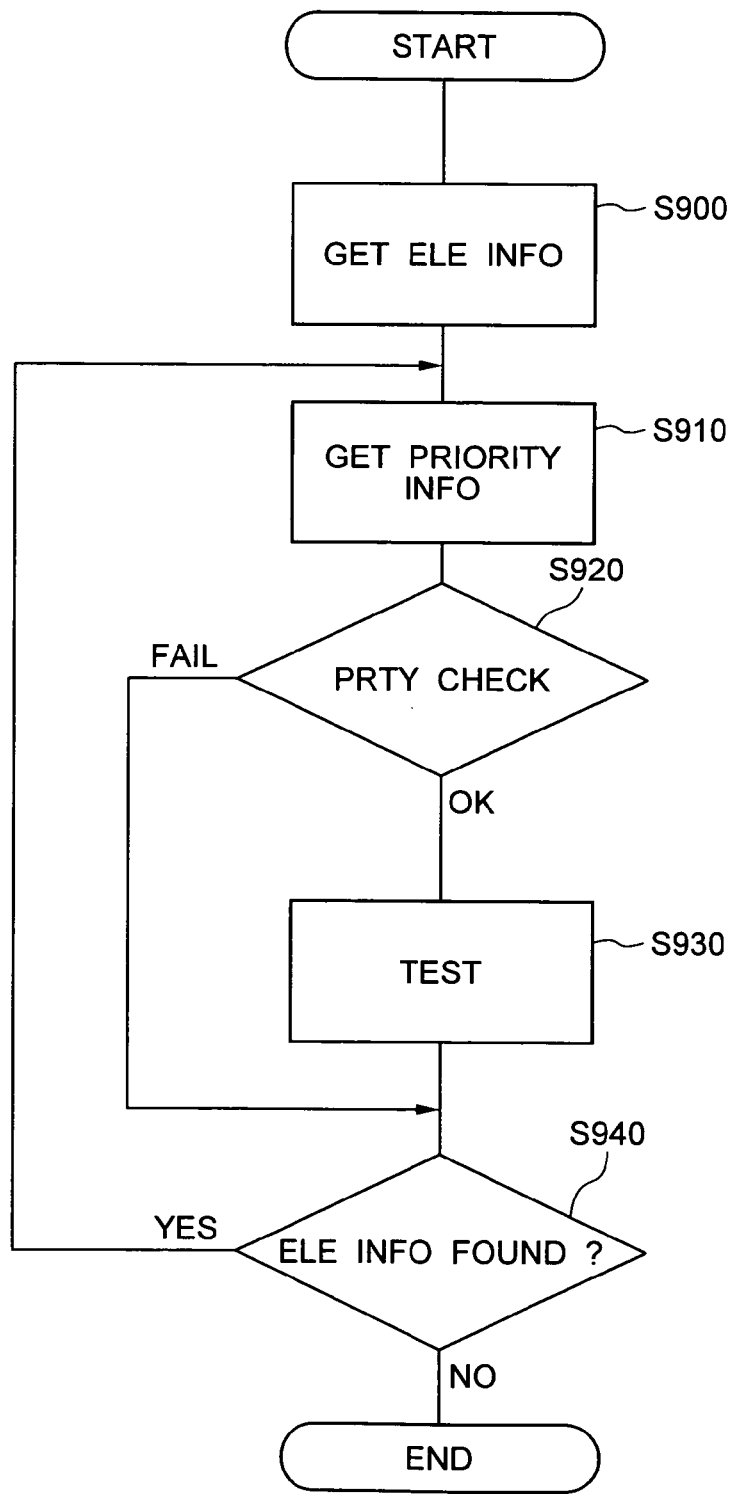
FIG. 19 is a diagram for explanation of a processing routine for determining whether inspection is to be done based on the priority information of an element to be tested.

FIG. 19 is a diagram for explanation of the processing that determines whether inspection is to be done or not on the basis of the priority (level of importance) information of a to-be-tested element(s). First, acquire an instance of element information within a region under test (at step 900). Then, obtain an instance of priority information of the element information (step 910). Next, judge whether the testing is to be done in a way conformity with the degree of priority (step 920). In the case of an element with its priority reaching the level indicative of a need for inspection, execute testing for investigation (step 930). The processing above will be repeated until no other instances of the element information are found (step 940).

By narrowing or limiting candidates for the to-be-tested object in accordance with the priority thereof, it becomes possible to improve the throughput of inspection.

Figure 20:
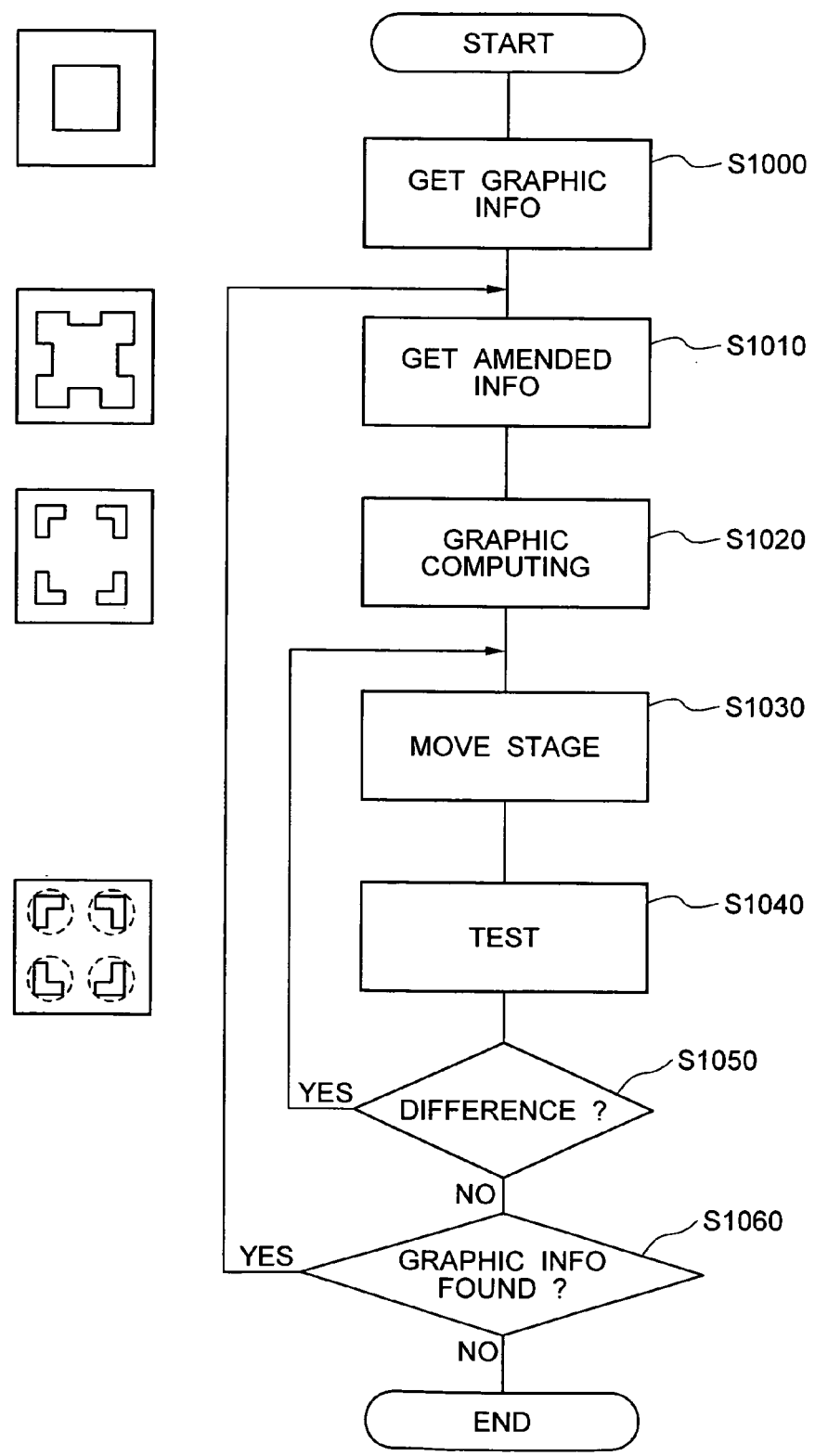
FIG. 20 is a diagram for explanation of a processing routine which determines whether inspection is to be done based on the modify information in graphics information.

FIG. 20 is a diagram for explanation of the processing that determines whether inspection is to be done on the basis of the modified information in the graphics information. In the illustrative example, only portions which have been modified or "amended" are subjected to testing. First, acquire an instance of the graphics information (indicated on the left side of the flowchart) within a region to be tested (at step 1000). Then, get an instance of amended information (step 1010). This amended information is also retainable as one of image draw information items of the element information 50 in the form of the instance of graphics information 90 in a way independent of graphic information 90 prior to execution of amendment. Perform graphical processing of both the graphic information and the amended information (step 1020). Here, obtain a difference of graphics. In case such difference graphic is present, move the stage toward a location overlying the difference graphic (step 1030), followed by performing inspection of this graphic portion (step 1040). Next, judge whether another difference graphic is present or absent (step 1050); then, the process of moving the stage and doing inspection will be repeated until no further difference graphics are found. The above processing routine will be repeated until depletion of any other instances of the graphics information (step 1060).

By narrowing or limiting the to-be-tested object to certain part that has experienced amendment in this way, it becomes possible to improve the throughput of inspection.

Figure 21:
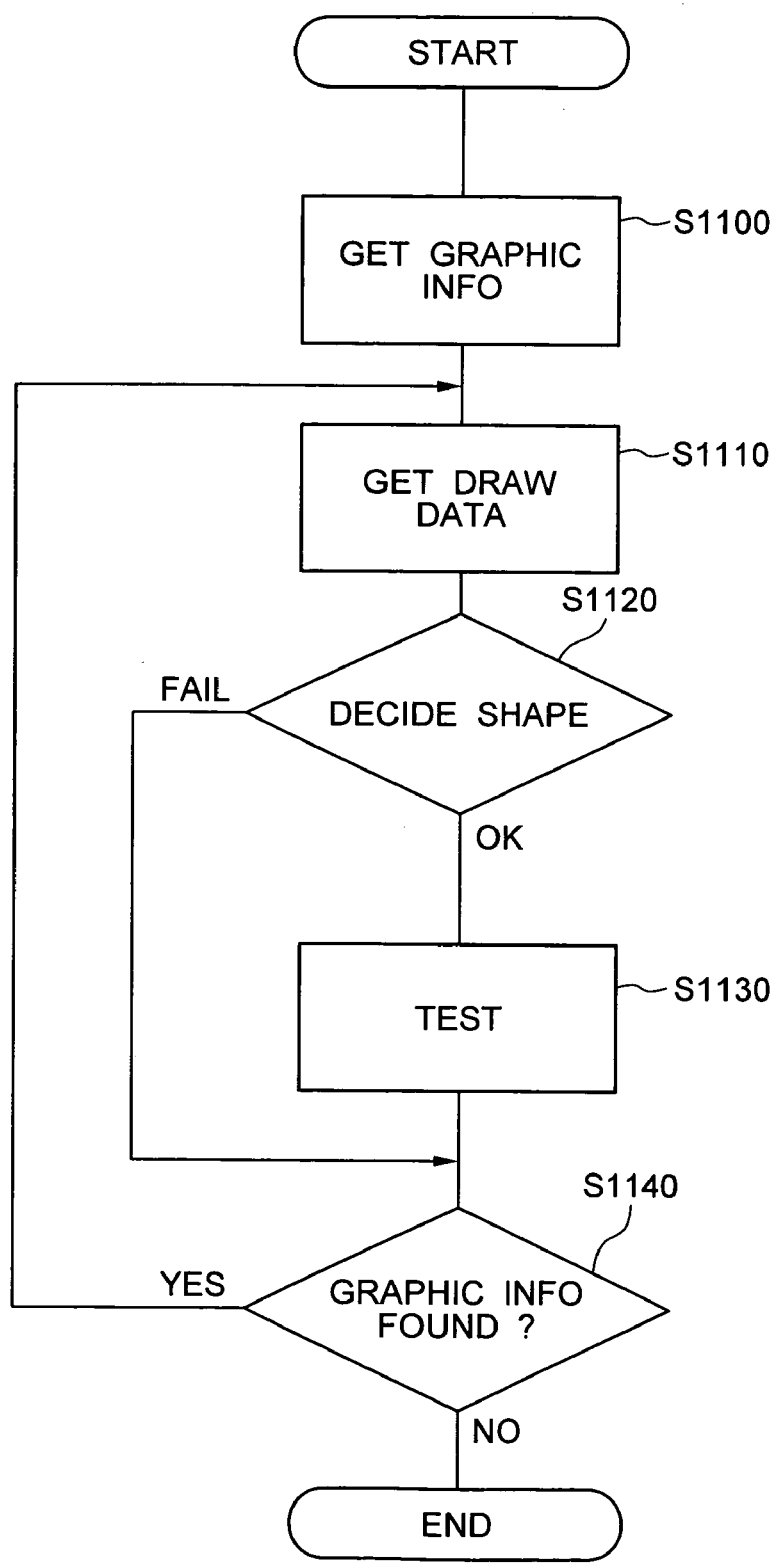
FIG. 21 is a diagram for explanation of a processing routine for setting, based on graphics information, only a portion having a specific preset shape as the to-be-tested object.

FIG. 21 is a diagram for explanation of the processing which identifies a portion that has a specific preset shape and then sets only this portion as the to-be-tested object based on the graphic information. First, acquire an instance of graphic information within a to-be-tested region (at step 1100). Then, get image draw data (step 1110), followed by execution of shape determination (step 1120). For example, judge whether an object under test has a corner point or "apex" with its angle equivalent to any one of 45 degrees, 135 degrees, 225 degrees and 315 degrees. If this judgment results in hit of such graphic, then execute inspection (step 1130). The above processing will be repeated until no other instances of graphics information are available (step 1140).

By limiting the to-be-tested object only to certain portions with specific shapes in this way, it becomes possible to improve the throughput of inspection.

Figure 22:
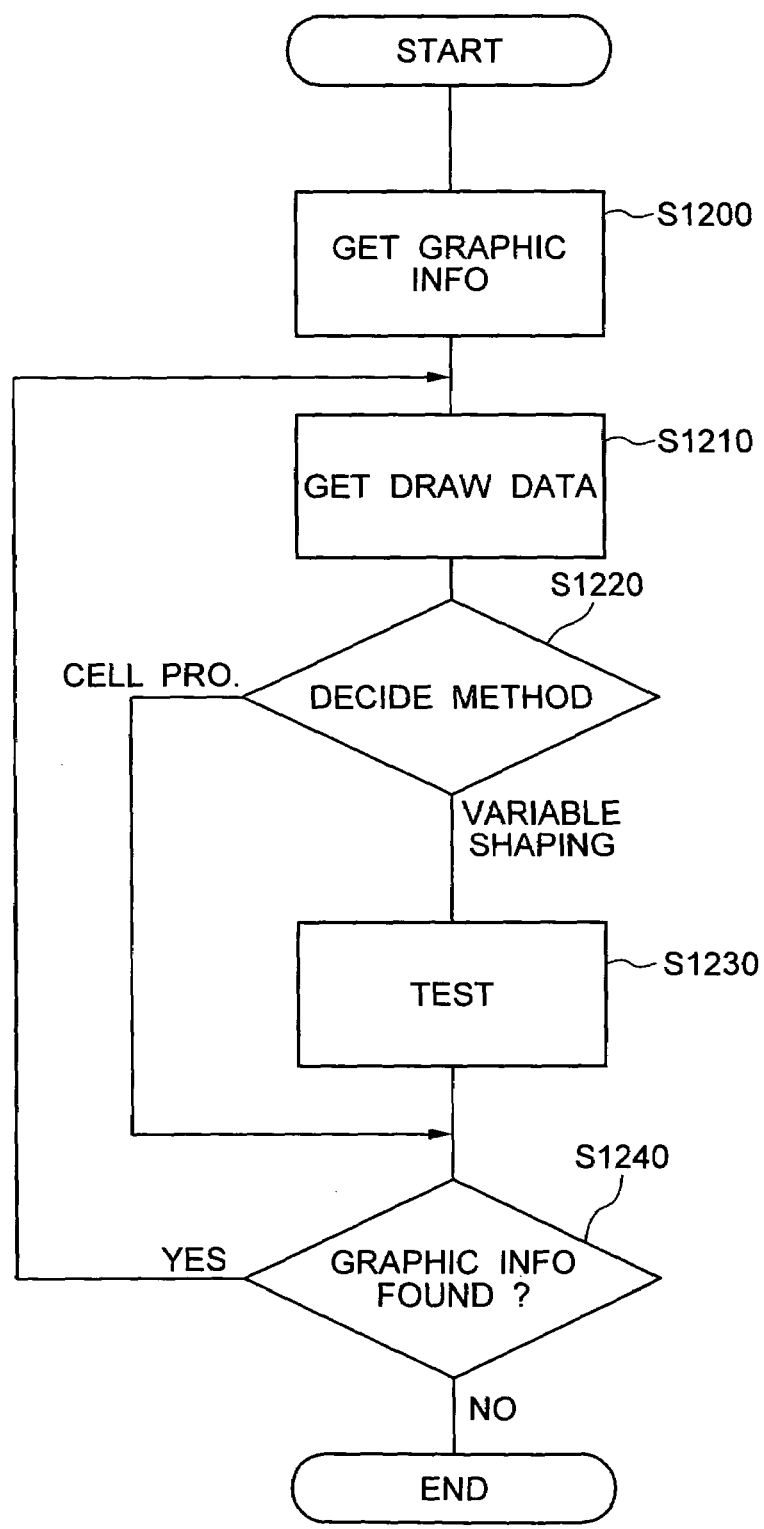
FIG. 22 is a diagram for explanation of a processing routine for judging image draw by cell projection based on graphics information and for performing, when judging it as image draw due to the cell projection, exclusion from a list of to-be-tested objects.

FIG. 22 is a diagram for explanation of the processing that determines the inclusion of image-draw or depiction by means of cell projection on the basis of graphics information and excludes it from a list of to-be-tested objects in the case of determination of the depiction by the cell projection. In the example shown herein, the exclusion from the to-be-tested object is done under an assumption that the depiction by cell projection is achievable with enhanced uniformity, high accuracy and increased stability. First, acquire an instance of graphics information within a region to be processed (at step 1200). Then, get an instance of image draw information of the graphic information (step 1210). Then, determine whether an aperture number for execution of cell projection is added to the opening information 120 that the draw information is a child class of graphic information 90 (step 1220). In the event that the draw information is added such aperture number of cell projection, testing is not performed; alternatively, in the case of the presence of image-draw coordinate information only, execute testing (step 1230). The processing above will be repeated until no further instances of graphics information are found (step 1240).

By excluding any test-unnecessary portions from the list of to-be-tested objects in this way, it becomes possible to improve the throughput of inspection.

Figure 23:
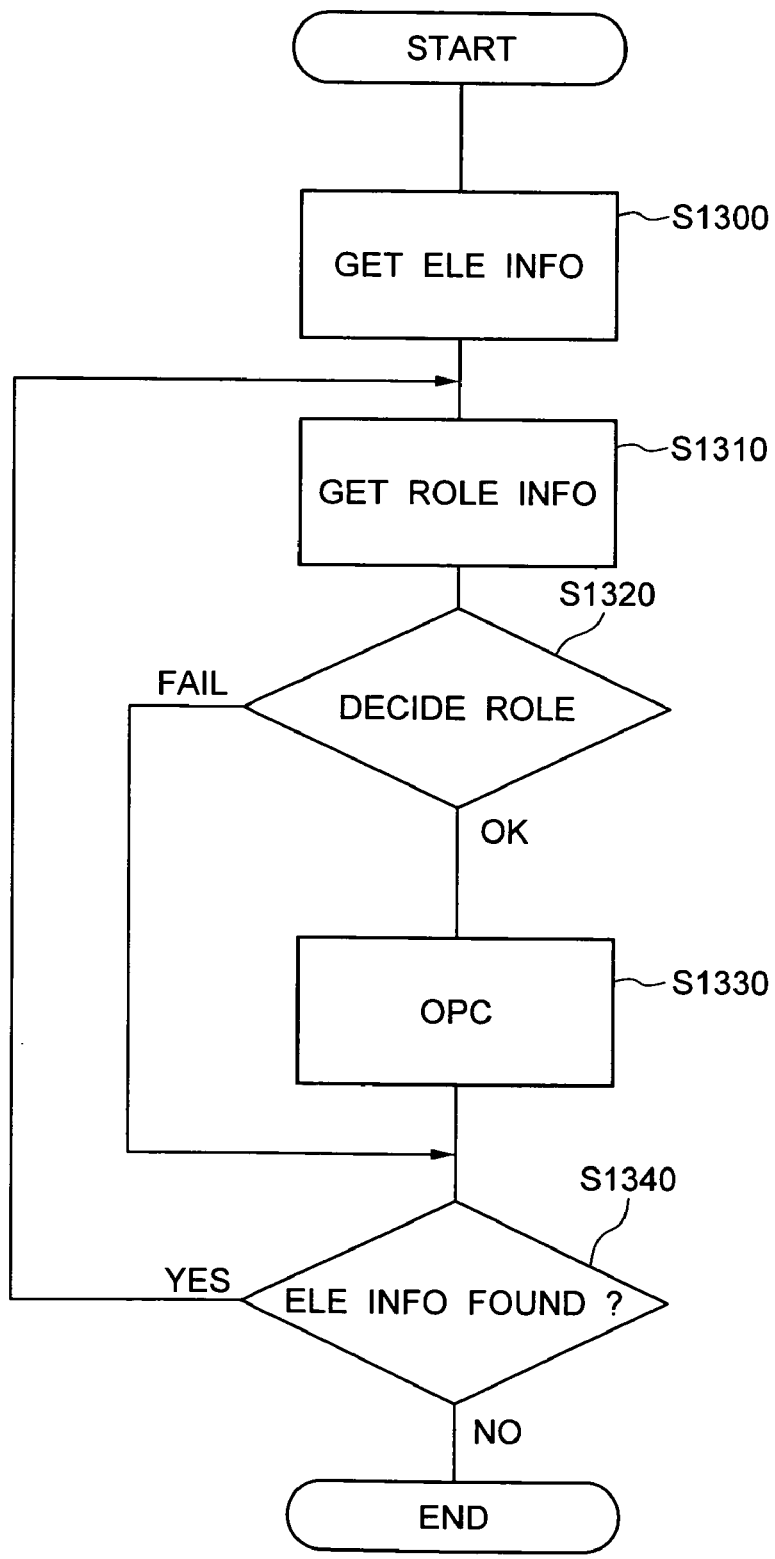
FIG. 23 is a diagram showing an example for judgment of whether modification is necessary or not in accordance with the role of an element(s).

FIG. 23 is a diagram showing an example which determines whether amendment is necessary or not in a way pursuant to the role of an element. Here, an explanation will be given while assuming that the amendment is exemplified as optical proximity correction (OPC). First, acquire an instance of element information within the region of interest (at step 1300). Then, get an instance of role information of the element information (step 1310). Next, determine whether the role information coincides with preset conditions (step 1320). If coincidence is verified then execute OPC (step 1330).

An example of the conditions is as follows: if the element is a dummy pad, then set "OPC Not Required" because such pad requires no accuracy; if a wiring line or via then set "OPC Required" since this requires accuracy. Note here that in the case of setting the wiring line to "OPC Required," it is also possible to employ parts-sensitive setup schemes. An example is as follows: high-accuracy OPC is strictly applied to power supply wiring leads and/or clock signal transmission lines while differently applying to the other wires an OPC process with low or coarse precision. The processing above will be recurrently executed as long as an instance of graphics information is present (step 1340).

By limiting the to-be-tested objects in this way, it becomes possible to shorten a time required for amendment processing.

Figure 24:
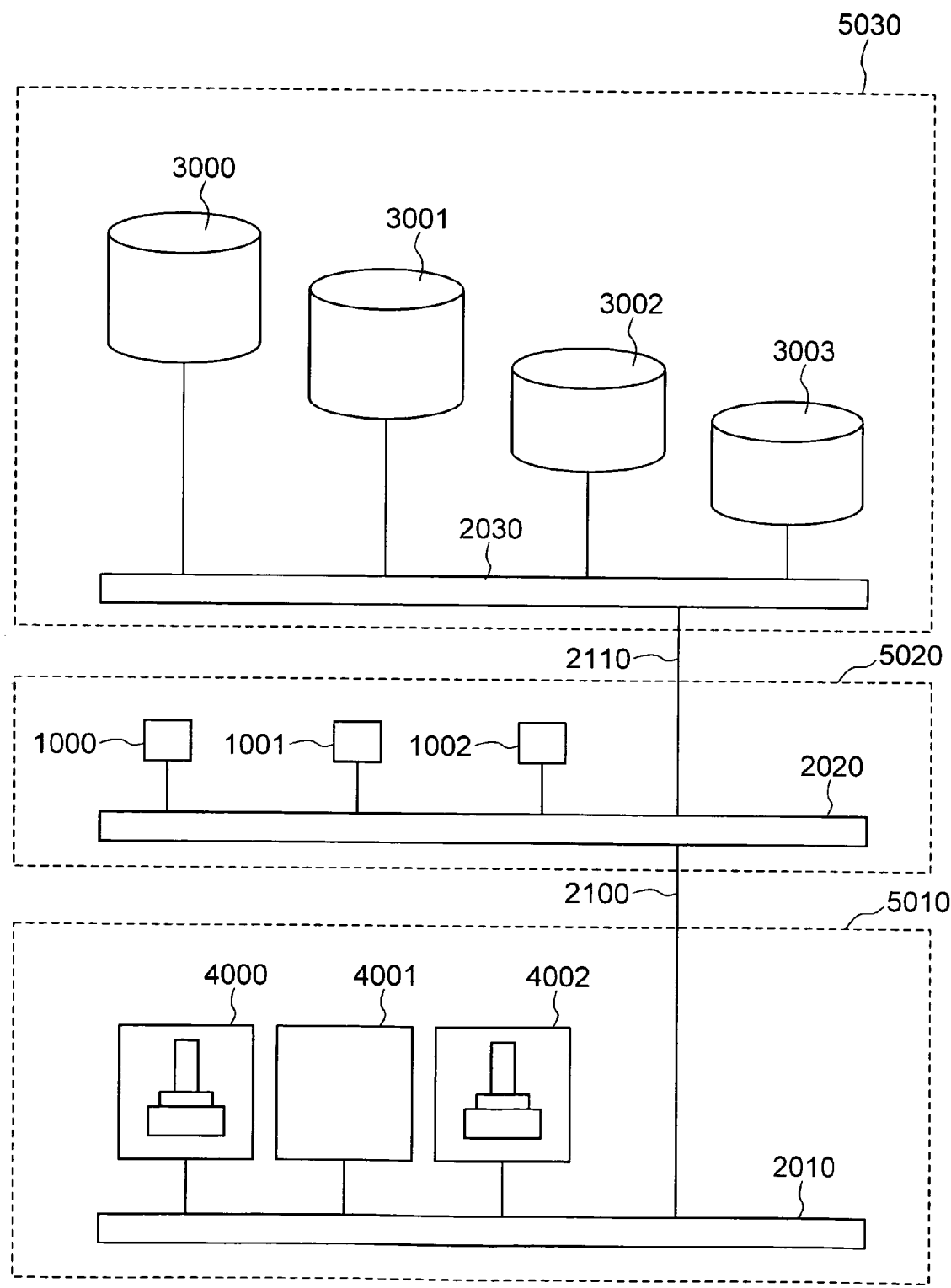
FIG. 24 is a diagram showing a layout example of computers and storage devices in a semiconductor production system.

FIG. 24 is a diagram showing an exemplary layout of computers and storage devices in a semiconductor production system. In this example shown herein, the computers and storage devices are physically separated from one another. Additionally, between respective apparatuses, it is possible to logically own in common or "share" a computer(s) and a storage device(s).

In a clean room 5010, a lithography apparatus 4000, a process apparatus 4001 and an inspection apparatus 4002 are provided and installed. A respective one of them is operatively connected to an interexchange or "repeater" device 2010, such as a switch array or Fabric module or the like. In a computer room 5020, computers 1000, 1001, 1002 are placed, each of which is connected to a repeater device 2020, such as a switch array or Fabric module or else. In a data center 5030, storage devices 3000, 3001, 3002, 3003 are located, each of which is coupled to a repeater device 2030, such as a switch array or Fabric module or else. The clean room 5010, computer room 5020 and data center 5030 are linked together via communications paths or channels 2100 and 2110.

By arranging the system in this way, it is no longer required to install the computers and storage devices in the clean room 5010 at the site for semiconductor mass-production with various types of apparatuses provided therein. Thus it becomes possible to reduce the floor area of clean room 5010. It is also possible to reduce the cost for construction and maintenance of the cleanroom.

In addition, it becomes possible, by excluding the computers 1000–1002 from the cleanroom 5010, to make easier maintenance works including, but not limited to, replacing of a computer(s) while at the same time making it possible to alleviate problems as to waste heat and electromagnetic compatibility (EMC). Furthermore, it becomes possible to manage certain instances—these are important and critical data—by the data center 5030 which is separated from the cleanroom 5010. This is also advantageous for countermeasures against natural disaster, such as earthquake or the like.

Also importantly, by adequate selection of the communications link 2100, 2110 and switch or Fabric 2010, 2020, 2030, it becomes possible to scalably change the size of decentralization of the semiconductor production system. An example is that the communications link 2100, 2110 and the switch or Fabric 2010, 2020, 2030 are designed to support the so-called Fibre Channel architecture while employing optical fibers. With this approach, it is possible to achieve distribution with an extended coverage of 10 kilometers (KM) in the longest. Alternatively, when letting communications link 2100, 2110 be part of wide area Internet protocol (IP) networks, it becomes possible to attain global-scale decentralization.

As has been described above, this embodiment is specifically arranged to logically store or record the information as to the design, manufacture and inspection of semiconductors and further add meta data such as priority or else to the information thus recorded. This makes it possible to seamlessly handle the data among semiconductor logic design, manufacture and inspection departments. Thus, any data format conversion is no longer required, avoiding the risk of data losses otherwise occurring due to such format conversion. It is thus possible to improve the accuracy of processing in each of the design, manufacture and inspection departments. It is also possible to improve throughputs.

As apparent from the foregoing, according to the present invention, it is possible to provide an improved semiconductor production system capable of seamlessly handling various kinds of information items concerning semiconductor design, manufacture and inspection processes.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor production system comprising:
    a storage device for storing information concerning semiconductor design and information as to semiconductor manufacture and also every information of semiconductor inspection while representing as a class an instance added with meta data indicative of a role of said information in accordance with a logical expressive form; and
    a storage device-use network for connection between respective ones of said storage device and a semiconductor manufacture apparatus and also a semiconductor inspection apparatus, wherein
    said storage device is seamlessly accessible from said semiconductor manufacture apparatus, said semiconductor inspection apparatus and a semiconductor design environment.

2. The semiconductor production system according to claim 1, wherein said semiconductor manufacture apparatus comprises an image drawing device, and wherein said image drawing device is variable in its drawing speed based on priority data of an instance.

3. The semiconductor production system according to claim 1, wherein said semiconductor manufacture apparatus comprises means for scheduling drawing speed of an image drawing device, and wherein the scheduling of drawing speed is done based on priority data of an instance.

4. The semiconductor production system according to claim 1, wherein said semiconductor manufacture apparatus comprises an image drawing device, and wherein the image drawing device is changeable in its drawing speed based on graphic density data of an instance.

5. The semiconductor production system according to claim 1, wherein said semiconductor manufacture apparatus comprises means for scheduling drawing speed of an image drawing device, and wherein the scheduling of drawing speed is done based on graphic density data of an instance.

6. The semiconductor production system according to claim 1, wherein said semiconductor manufacture apparatus comprises an image drawing device, and wherein the image drawing device is changeable in its drawing speed based on role data of an instance.

7. The semiconductor production system according to claim 1, wherein said semiconductor manufacture apparatus comprises means for scheduling drawing speed of an image drawing device, and wherein the scheduling of drawing speed is done based on role data of an instance.

8. The semiconductor production system according to claim 1, wherein said semiconductor manufacture apparatus comprises an image drawing device, and wherein the image drawing device is changeable in its drawing speed based on an instance of another layer making up a semiconductor device.

9. The semiconductor production system according to claim 1, wherein said semiconductor manufacture apparatus comprises means for scheduling drawing speed of an image drawing device, and wherein the scheduling of drawing speed is done based on an instance of another layer making up a semiconductor device.

10. The semiconductor production system according to claim 1, wherein said semiconductor manufacture apparatus comprises an image drawing device, and wherein the image drawing device is changeable in its drawing speed based on area information of an instance of another layer making up a semiconductor device.

11. The semiconductor production system according to claim 1, wherein said semiconductor manufacture apparatus comprises means for forming a resist at a surface of a semiconductor device, and wherein a kind of the resist is selectable based on area information of an instance of another layer making up the semiconductor device.

12. The semiconductor production system according to claim 1, wherein said semiconductor inspection apparatus selects an inspection object based on role data of an instance.

13. The semiconductor production system according to claim 1, wherein said semiconductor inspection apparatus selects an inspection position based on role data of an instance.

14. The semiconductor production system according to claim 1, wherein said semiconductor inspection apparatus determines an inspection position based on modified data of an instance.

15. The semiconductor production system according to claim 1, wherein said semiconductor manufacture apparatus comprises means for drawing an image by a cell projection scheme.

* * * * *